(12) United States Patent
Park et al.

(10) Patent No.: US 10,939,552 B2
(45) Date of Patent: Mar. 2, 2021

(54) ELECTRONIC DEVICE INCLUDING INTERPOSER

(71) Applicant: Samsung Electronics Co., Ltd., Suwon-si (KR)

(72) Inventors: Jungsik Park, Suwon-si (KR); Soyoung Lee, Gwacheon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/887,585

(22) Filed: May 29, 2020

(65) Prior Publication Data

US 2020/0296833 A1    Sep. 17, 2020

Related U.S. Application Data

(63) Continuation of application No. 16/121,085, filed on Sep. 4, 2018, now Pat. No. 10,674,607.

(30) Foreign Application Priority Data

Sep. 12, 2017  (KR) .......................... 10-2017-0116517

(51) Int. Cl.
*H05K 1/11*    (2006.01)
*H05K 1/14*    (2006.01)
(Continued)

(52) U.S. Cl.
CPC ........... *H05K 1/144* (2013.01); *G06F 1/1626* (2013.01); *G06F 1/1635* (2013.01);
(Continued)

(58) Field of Classification Search
CPC .................. H05K 1/144; H05K 1/116; H05K 2201/10378; H05K 1/0216;
(Continued)

(56) References Cited

U.S. PATENT DOCUMENTS 4,682,270 A    7/1987  Whitehead et al.
5,956,835 A    9/1999  Aksu
(Continued)

FOREIGN PATENT DOCUMENTS

EP    2 503 861 A2    9/2012
JP    2005-0251889 A    9/2005
(Continued)

OTHER PUBLICATIONS

International Search Report dated Dec. 11, 2018, issued in the International Application No. PCT/KR2018/010215.
(Continued)

*Primary Examiner* — Yuriy Semenenko
(74) *Attorney, Agent, or Firm* — Jefferson IP Law, LLP

(57) ABSTRACT

An electronic device including an interposer is provided. The electronic device includes a first circuit board having a first connection terminal formed thereon, an application processor (AP) connected to the first connection terminal and deployed on the first circuit board, an interposer having a via formed therein and having a first surface attached to the first circuit board, the interposer at least partly surrounding at least a partial region of the first circuit board and a first end portion of the via being electrically connected to the first connection terminal, a second circuit board having a second connection terminal formed thereon and attached to a second surface of the interposer in an opposite direction to the first surface, the second connection terminal being electrically connected to a second end portion of the via and the second circuit board forming an inner space together with the first circuit board and the interposer, a communication processor (CP) connected to the second connection terminal and deployed on the second circuit board, and an antenna electrically connected to the CP.

10 Claims, 27 Drawing Sheets

(51) Int. Cl.
*G06F 1/16* (2006.01)
*H01Q 1/52* (2006.01)
*H04M 1/02* (2006.01)
*H04B 1/3883* (2015.01)
*G06F 1/20* (2006.01)
*G06F 1/26* (2006.01)
*H01Q 9/04* (2006.01)
*H01R 12/53* (2011.01)
*H01Q 9/42* (2006.01)
*H01Q 1/24* (2006.01)
*H01Q 21/06* (2006.01)
*H05K 1/02* (2006.01)
*H05K 1/18* (2006.01)

(52) U.S. Cl.
CPC .......... *G06F 1/1656* (2013.01); *G06F 1/1658* (2013.01); *G06F 1/1698* (2013.01); *G06F 1/203* (2013.01); *G06F 1/263* (2013.01); *H01Q 1/526* (2013.01); *H01Q 9/0407* (2013.01); *H01R 12/53* (2013.01); *H04B 1/3883* (2013.01); *H04M 1/026* (2013.01); *H04M 1/0262* (2013.01); *H04M 1/0277* (2013.01); *H05K 1/116* (2013.01); *H01Q 1/243* (2013.01); *H01Q 9/42* (2013.01); *H01Q 21/065* (2013.01); *H05K 1/0216* (2013.01); *H05K 1/147* (2013.01); *H05K 1/181* (2013.01); *H05K 2201/042* (2013.01); *H05K 2201/10037* (2013.01); *H05K 2201/10098* (2013.01); *H05K 2201/10189* (2013.01); *H05K 2201/10371* (2013.01); *H05K 2201/10378* (2013.01)

(58) Field of Classification Search
CPC .......... H05K 2201/10371; H05K 2201/10037; H05K 2201/10189; H05K 2201/042; H05K 2201/10098; H05K 1/181; H05K 1/147; G06F 1/1656; G06F 1/1635; G06F 1/1698; G06F 1/1658; G06F 1/263; G06F 1/203; G06F 1/1626; H04B 1/3883; H04M 1/0277; H04M 1/0262; H04M 1/026; H01R 12/53; H01Q 9/0407; H01Q 1/526; H01Q 9/42; H01Q 1/243; H01Q 21/065
See application file for complete search history.

(56) References Cited

U.S. PATENT DOCUMENTS

| | | | |
|---|---|---|---|
| 6,697,261 | B2 | 2/2004 | Matsuda |
| 6,731,514 | B2 | 5/2004 | Evans |
| 7,180,752 | B2 | 2/2007 | Chamberlin et al. |
| 7,268,419 | B2 | 9/2007 | Cornelius |
| 9,721,881 | B1 | 8/2017 | Gong et al. |
| 2001/0046129 | A1* | 11/2001 | Broglia ............ H01R 12/52 361/803 |
| 2004/0156177 | A1 | 8/2004 | Higashitani |
| 2005/0052858 | A1 | 3/2005 | Shima |
| 2005/0260867 | A1* | 11/2005 | Ono ............ H05K 1/144 439/65 |
| 2008/0101049 | A1 | 5/2008 | Casto et al. |
| 2008/0229822 | A1* | 9/2008 | Kato ............ G01C 19/574 73/504.12 |
| 2009/0268423 | A1 | 10/2009 | Sakurai et al. |
| 2010/0298027 | A1 | 11/2010 | Yun |
| 2011/0073355 | A1 | 3/2011 | Tamura |
| 2012/0243195 | A1* | 9/2012 | Lim ............ H05K 1/141 361/784 |
| 2013/0020702 | A1* | 1/2013 | Zhai ............ H01L 25/0657 257/738 |
| 2013/0201615 | A1 | 8/2013 | Arnold et al. |
| 2013/0286609 | A1 | 10/2013 | Merz |
| 2013/0299221 | A1 | 11/2013 | Oh et al. |
| 2015/0016078 | A1* | 1/2015 | Yang ............ C23C 28/40 361/762 |
| 2015/0109170 | A1 | 4/2015 | Kang et al. |
| 2015/0372372 | A1* | 12/2015 | Lee ............ H01Q 1/243 343/702 |
| 2018/0084092 | A1 | 3/2018 | Cho et al. |
| 2018/0359847 | A1* | 12/2018 | Copley ............ H05K 1/115 |

FOREIGN PATENT DOCUMENTS

| | | |
|---|---|---|
| JP | 2011-071435 A | 4/2011 |
| KR | 10-2013-0114330 A | 10/2013 |
| WO | 2016/153101 A1 | 9/2016 |

OTHER PUBLICATIONS

Extended European Search Report dated Feb. 12, 2019, issued in the European Application No. 18192713.
Extended European Search Report dated Oct. 2, 2020, issued in European Patent Application No. 20180231.1.

* cited by examiner

ELECTRONIC DEVICE INCLUDING INTERPOSER

CROSS-REFERENCE TO RELATED APPLICATION(S)

This application is a continuation application of prior application Ser. No. 16/121,085, filed on Sep. 4, 2018, which application is based on and claims priority under 35 U.S.C. § 119(a) of a Korean patent application number 10-2017-0116517, filed on Sep. 12, 2017, in the Korean Intellectual Property Office, the disclosure of which is incorporated by reference herein in its entirety.

BACKGROUND

1. Field of the Invention

The disclosure relates to an electronic device including an interposer. More particularly, the disclosure relates to an electronic device including an interposer, which can reduce an area of a printed circuit board (PCB) by inserting the interposer, in which a space for mounting via and components therein is formed, between a first circuit board and a second circuit board and by laminating the first circuit board and the second circuit board, and can secure a battery extension space of the electronic device as large as the reduced area of the PCB.

2. Description of the Related Art

An electronic device, such as a portable terminal, is required to be miniaturized and to have multiple functions. For this, the electronic device includes a printed circuit board (PCB) on which various components are mounted (e.g., PCB, printed board assembly (PBA), and flexible printed circuit board (FPCB)).

The PCB may include a processor, a memory, a camera, a broadcast receiver module, and a communication module, which are necessary in the electronic device (e.g., a smart phone). The PCB may include circuit interconnects for connecting a plurality of electronic components mounted thereon.

The above information is presented as background information only to assist with an understanding of the disclosure. No determination has been made, and no assertion is made, as to whether any of the above might be applicable as prior art with regard to the disclosure.

SUMMARY

In order to lengthen the usage time of the electronic device, it is required to increase the capacity of a battery.

If the printed circuit board (PCB) built in the electronic device is formed in a single layer, it may be difficult to secure a space for extending the capacity of the battery.

In order to increase the battery capacity of the electronic device, it is required to reduce the area of the built-in PCB, and to secure a battery extension space.

Aspects of the disclosure are to address at least the above-mentioned problems and/or disadvantages and to provide at least the advantages described below. Accordingly, an aspect of the disclosure is to provide an electronic device including an interposer, which can reduce an area of a PCB by inserting the interposer, in which a space for mounting via and components therein is formed, between a first circuit board and a second circuit board and by laminating the first circuit board and the second circuit board, and can secure a battery extension space of the electronic device as large as the reduced area of the PCB.

Additional aspects will be set forth in part in the description which follows and, in part, will be apparent from the description, or may be learned by practice of the presented embodiments.

In accordance with an aspect of the disclosure, an electronic device is provided. The electronic device includes a first circuit board having a first connection terminal formed thereon, an application processor (AP) connected to the first connection terminal and deployed on the first circuit board, an interposer having a via formed therein and having a first surface attached to the first circuit board, the interposer at least partly surrounding at least a partial region of the first circuit board and a first end portion of the via being electrically connected to the first connection terminal, a second circuit board having a second connection terminal formed thereon and attached to a second surface of the interposer in an opposite direction to the first surface, the second connection terminal being electrically connected to a second end portion of the via and the second circuit board forming an inner space together with the first circuit board and the interposer, a communication processor (CP) connected to the second connection terminal and deployed on the second circuit board, and an antenna electrically connected to the CP.

In accordance with another aspect of the disclosure, an electronic device is provided. The electronic device includes a first circuit board having a first connection terminal formed thereon, a first electronic component connected to the first connection terminal and deployed on the first circuit board, an interposer having a via formed therein and having a first surface attached to the first circuit board, the interposer at least partly surrounding at least a partial region of the first circuit board and a first end portion of the via being electrically connected to the first connection terminal, a second circuit board having a second connection terminal formed thereon and attached to a second surface of the interposer in an opposite direction to the first surface, the second connection terminal being electrically connected to a second end portion of the via and the second circuit board forming an inner space together with the first circuit board and the interposer, a second electronic component connected to the second connection terminal and deployed on the second circuit board, and an antenna electrically connected to the second electronic component.

In accordance with another aspect of the disclosure, an electronic device is provided. The electronic device includes a first circuit board having a first connection terminal formed thereon, a first electronic component connected to the first connection terminal and deployed on the first circuit board, an interposer having a plating member and a via formed on a side surface thereof and having a first surface attached to the first circuit board, the interposer at least partly surrounding at least a partial region of the first circuit board and a first end portion of the via being electrically connected to the first connection terminal, a second circuit board having a second connection terminal formed thereon and attached to a second surface of the interposer in an opposite direction to the first surface, the second connection terminal being electrically connected to a second end portion of the via and the second circuit board forming an inner space together with the first circuit board and the interposer, a second electronic component connected to the second connection terminal and deployed on the second circuit board, and an antenna electrically connected to the second electronic component.

According to the various aspects of the disclosure, since the interposer in which the space for mounting the via and components therein is formed is inserted between the first circuit board and the second circuit board and the first circuit board and the second circuit board are laminated, the area of the PCB can be reduced, and the battery extension space of the electronic device can be secured as large as the reduced area of the PCB.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, like reference numerals will be understood to refer to like parts, components, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

By the term "substantially" it is meant that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

Figure 1:
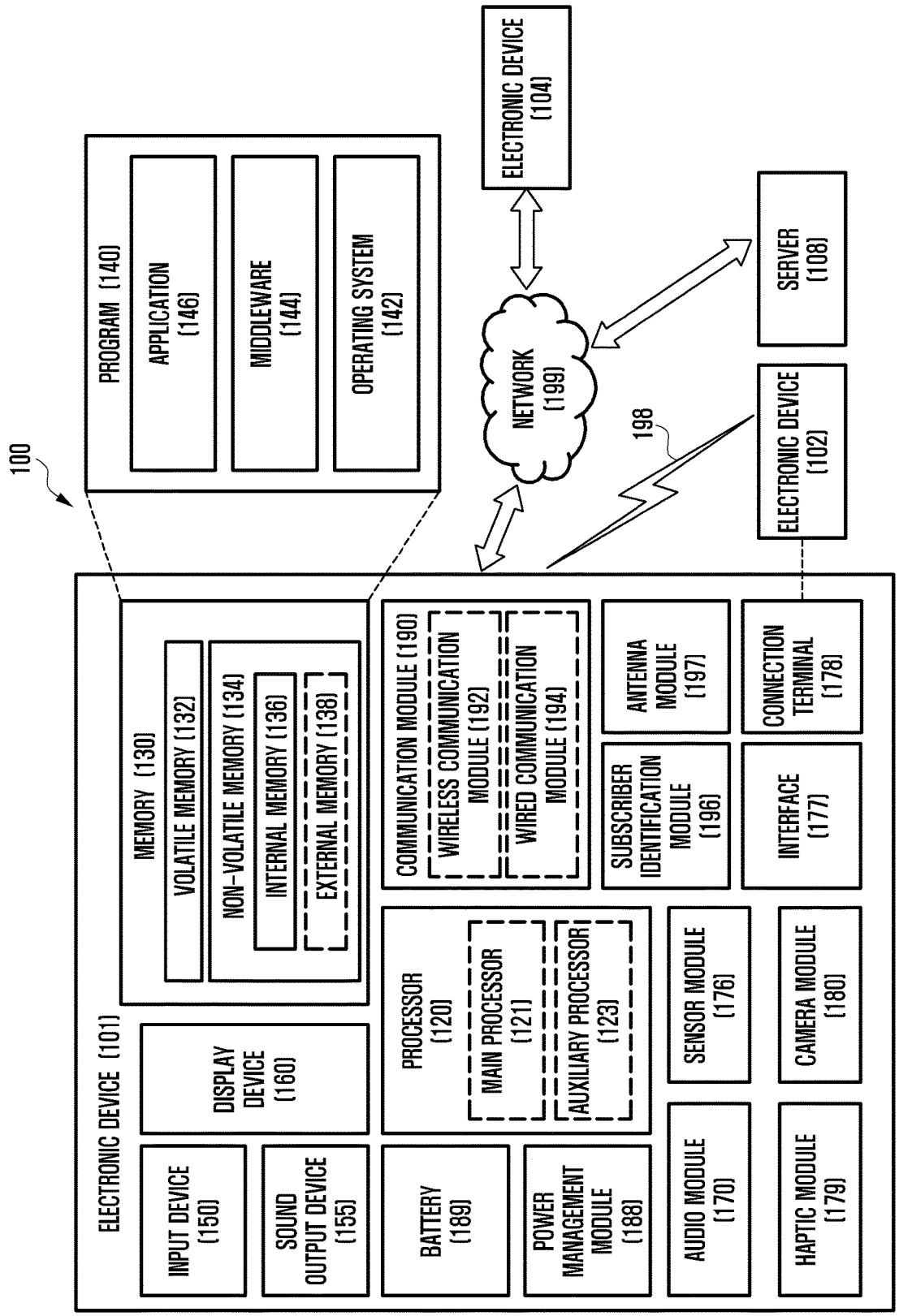
FIG. 1 is a block diagram illustrating an electronic device in a network environment according to various embodiments of the disclosure.

FIG. 1 is a block diagram illustrating an electronic device in a network environment according to various embodiments of the disclosure.

Referring to FIG. 1, an electronic device 101 in a network environment 100 may communicate with an electronic device 102 via a first network 198 (e.g., a short-range wireless communication network), or an electronic device 104 or a server 108 via a second network 199 (e.g., a long-range wireless communication network). According to an embodiment of the disclosure, the electronic device 101 may communicate with the electronic device 104 via the server 108. According to an embodiment of the disclosure, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments of the disclosure, at least one (e.g., the display device 160 or the camera module 180) of the components may be omitted from the electronic device 101, or one or more other components may be added in the electronic device 101. In some embodiments of the disclosure, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to an embodiment of the disclosure, as at least part of the data processing or computation, the processor 120 may load a command or data received from another component (e.g., the sensor module 176 or the communication module 190) in a volatile memory 132, process the command or the data stored in the volatile memory 132, and store resulting data in non-volatile memory 134. According to an embodiment of the disclosure, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive state (e.g., a sleep state), or together with the main processor 121 while the main processor 121 is in an active state (e.g., executing an application). According to an embodiment of the disclosure, the auxiliary processor 123 (e.g., an ISP or a CP) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by another component (e.g., the processor 120) of the electronic device 101, from the outside (e.g., a user) of the electronic device 101. The input device 150 may include, for example, a microphone, a mouse, or a keyboard.

The sound output device 155 may output sound signals to the outside of the electronic device 101. The sound output device 155 may include, for example, a speaker or a receiver. The speaker may be used for general purposes, such as playing multimedia or playing record, and the receiver may be used for incoming calls. According to an embodiment of the disclosure, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment of the disclosure, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment of the disclosure, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment of the disclosure, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment of the disclosure, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment of the disclosure, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment of the disclosure, the haptic module 179 may include, for example, a motor, a piezoelectric element, or an electric stimulator.

The camera module 180 may capture a still image or moving images. According to an embodiment of the disclosure, the camera module 180 may include one or more lenses, image sensors, ISPs, or flashes.

The power management module 188 may manage power supplied to the electronic device 101. According to one embodiment of the disclosure, the power management module 188 may be implemented as at least part of, for example, a power management integrated circuit (PMIC).

The battery 189 may supply power to at least one component of the electronic device 101. According to an embodiment of the disclosure, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more CPs that are operable independently from the processor 120 (e.g., the AP) and supports a direct (e.g., wired) communication or a wireless communication. According to an embodiment of the disclosure, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The antenna module 197 may transmit or receive a signal or power to or from the outside (e.g., the external electronic device) of the electronic device 101. According to an embodiment of the disclosure, the antenna module 197 may include one or more antennas, and, therefrom, at least one antenna appropriate for a communication scheme used in the communication network, such as the first network 198 or the second network 199, may be selected, for example, by the communication module 190 (e.g., the wireless communication module 192). The signal or the power may then be transmitted or received between the communication module 190 and the external electronic device via the selected at least one antenna.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment of the disclosure, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment of the disclosure, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspects (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment of the disclosure, the module may be implemented in a form of an application-specific integrated circuit (ASIC).

Various embodiments as set forth herein may be implemented as software (e.g., the program 140) including one or more instructions that are stored in a storage medium (e.g., an internal memory 136 or an external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

Certain aspects of the disclosure can also be embodied as computer readable code on a non-transitory computer readable recording medium. A non-transitory computer readable recording medium is any data storage device that can store data which can be thereafter read by a computer system. Examples of the non-transitory computer readable recording medium include a Read-Only Memory (ROM), a Random-Access Memory (RAM), Compact Disc-ROMs (CD-ROMs), magnetic tapes, floppy disks, and optical data storage devices. The non-transitory computer readable recording medium can also be distributed over network coupled computer systems so that the computer readable code is stored and executed in a distributed fashion. In addition, functional programs, code, and code segments for accomplishing the disclosure can be easily construed by programmers skilled in the art to which the disclosure pertains.

At this point it should be noted that the various embodiments of the disclosure as described above typically involve the processing of input data and the generation of output data to some extent. This input data processing and output data generation may be implemented in hardware or software in combination with hardware. For example, specific electronic components may be employed in a mobile device or similar or related circuitry for implementing the functions associated with the various embodiments of the disclosure as described above. Alternatively, one or more processors operating in accordance with stored instructions may implement the functions associated with the various embodiments of the disclosure as described above. If such is the case, it is within the scope of the disclosure that such instructions may be stored on one or more non-transitory processor readable mediums. Examples of the processor readable mediums include a ROM, a RAM, CD-ROMs, magnetic tapes, floppy disks, and optical data storage devices. The processor readable mediums can also be distributed over network coupled computer systems so that the instructions are stored and executed in a distributed fashion. In addition, functional computer programs, instructions, and instruction segments for accomplishing the present disclosure can be easily construed by programmers skilled in the art to which the present disclosure pertains.

According to various embodiments of the disclosure, each component (e.g., a module or a program) of the above-described components may include a single entity or multiple entities. According to various embodiments of the disclosure, one or more of the above-described components may be omitted, or one or more other components may be added. Alternatively or additionally, a plurality of components (e.g., modules or programs) may be integrated into a single component. In such a case, according to various embodiments of the disclosure, the integrated component may still perform one or more functions of each of the plurality of components in the same or similar manner as they are performed by a corresponding one of the plurality of components before the integration. According to various embodiments of the disclosure, operations performed by the module, the program, or another component may be carried out sequentially, in parallel, repeatedly, or heuristically, or one or more of the operations may be executed in a different order or omitted, or one or more other operations may be added.

Figure 2:
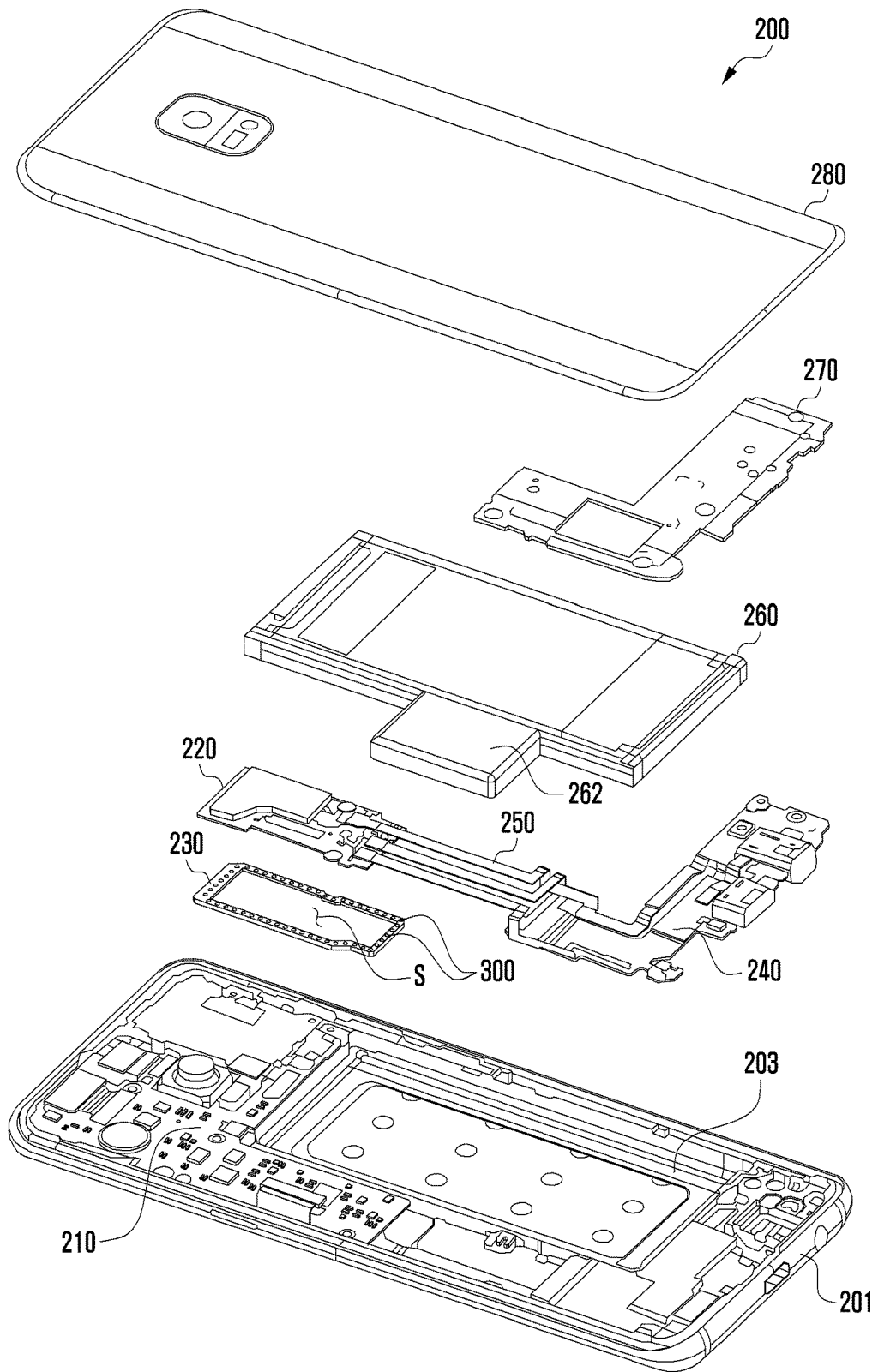
FIG. 2 is an exploded perspective view of partial configurations of an electronic device according to various embodiments of the disclosure.
Figure 3:
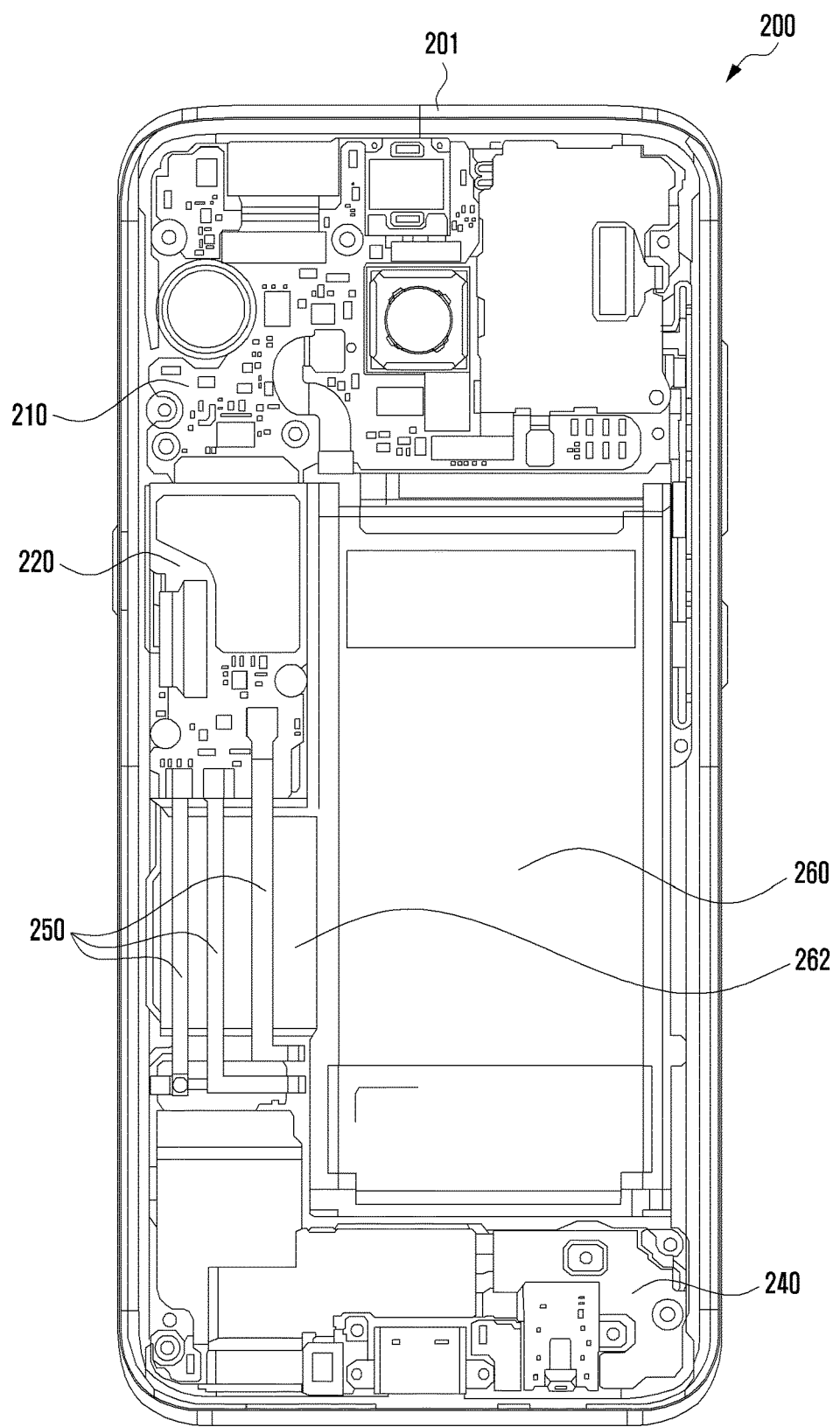
FIG. 3 is a combined view of partial configurations of an electronic device according to various embodiments of the disclosure.

FIG. 2 is an exploded perspective view of partial configurations of an electronic device according to various embodiments of the disclosure, and FIG. 3 is a combined view of partial configurations of an electronic device according to various embodiments of the disclosure.

Referring to FIGS. 2 and 3, an electronic device 200 according to various embodiments of the disclosure may include a housing 201, a first circuit board 210, a second circuit board 220, an interposer 230, a third circuit board 240, a connector 250, a first battery 260, a second battery 262, an antenna module 270, and a back cover 280.

According to various embodiments of the disclosure, the electronic device 200 may include the electronic device (at least one of 101, 102, and 104) of FIG. 1. The first battery 260 and the second battery 262 may include the battery 189 of FIG. 1. The antenna module 270 may include the antenna module 197 of FIG. 1. The back cover 280 may be provided on the back of the electronic device 101 of FIG. 1. Each of the first circuit board 210, the second circuit board 220, and the third circuit board 240 may include at least one connection terminal (e.g., a connector) for electrically connecting to other constituent elements. Each of the first circuit board 210, the second circuit board 220, and the third circuit board 240 may include a printed circuit board (PCB), a printed board assembly (PBA), and a flexible printed circuit board (FPCB).

The housing 201 may be configured in a side bezel structure to accommodate the constituent elements of the electronic device 200 as described above, such as the first circuit board 210, the second circuit board 220, the interposer 230, the third circuit board 240, the connector 250, the first battery 260, the second battery 262, the antenna module 270, and the back cover 280. At least a part of an external exposure surface of the housing 201 may be made of a conductive material (e.g., metal). At least a part of the external exposure surface of the housing 201 may be used as an antenna of the electronic device 200.

According to an embodiment of the disclosure, the housing 201 may include a support member (e.g., a bracket) 203 provided therein. The support member 203 may accommodate therein and support constituent elements of the electronic device 200. The support member 203 may be integrally formed on one surface of the housing 201. The support member 203 may be formed of, for example, a metal material and/or a non-metal material (e.g., polymer).

The first circuit board 210 may be deployed in at least a part of the housing 201. The first circuit board 210 may include a processor (e.g., the processor 120 of FIG. 1) required to operate the electronic device 200, a memory (e.g., the memory 130 of FIG. 1), a communication circuit (e.g., the communication module 190 of FIG. 1), a power management module (e.g., the power management module 188 of FIG. 1), and/or an interface (e.g., the interface 177 of FIG. 1).

According to an embodiment of the disclosure, the processor (e.g., the processor 120 of FIG. 1) may include one or more of a CPU, an AP (e.g., an AP 212 of FIG. 6), a call processor (e.g., a call processor 214 of FIG. 6), a graphic processor, an ISP, a sensor hub processor, and a CP. The memory (e.g., the memory 130 of FIG. 1) may include, for example, a volatile memory or a non-volatile memory. The communication circuit (e.g., the communication module 190 of FIG. 1) may include, for example, a wireless communication module (e.g., the wireless communication module 192 of FIG. 1) or a wired communication module (e.g., the wired communication module 194 of FIG. 1). The interface (e.g., interface 177 of FIG. 1) may include, for example, a HDMI, a USB interface, an SD card interface, and/or an audio interface. For example, the interface may electrically or physically connect the electronic device 200 to an external electronic device (e.g., the electronic device 102 of FIG. 1), and may include a USB connector, an SD card/MMC connector, or an audio connector.

The second circuit board 220 may be laminated on the first circuit board 210 through the interposer 230. The second circuit board 220 may include a transceiver (e.g., a transceiver 221 of FIG. 6) or a wireless communication module (e.g., a Wi-Fi module) in which a (e.g., the call processor 214 of FIG. 6) and a transceiver are integrated.

The interposer 230 may be deployed between the first circuit board 210 and the second circuit board 220. The interposer 230 may include a space S in which at least one component mounted on the second circuit board 220 (e.g., the AP 212 of FIG. 6, call processor 214, transceiver 221, and Wi-Fi module) is deployed. The interposer 230 may include at least one via 300 for electrically connecting the first circuit board 210 and the second circuit board 220 to each other.

The third circuit board 240 may further include at least one antenna (e.g., an antenna 275 of FIG. 4) for transmitting/receiving a signal or power to/from an outside or a connection terminal connected to the antenna.

The connector 250 may electrically connect the first circuit board 210, the second circuit board 220, and the third circuit board 240 to each other.

The first battery 260 (e.g., the battery 189 of FIG. 1) may supply the power to at least one constituent element of the electronic device 200.

The second battery 262 may supply the power to at least one constituent element of the electronic device 200. The second battery 262 may be an auxiliary battery for increasing the capacity of the first battery 260. The second battery 262 may be deployed in a space secured by laminating the first circuit board 210 and the second circuit board 220 through the interposer 230.

According to an embodiment of the disclosure, the second battery 262 may be deployed between the second circuit board 220 and the third circuit board 240. According to an embodiment of the disclosure, the connector 250 may electrically connect the second circuit board 220 and the third circuit board 240 to each other, and may be deployed on at least one of an upper portion, a lower portion, and a side portion of the first battery 260 or the second battery 262.

According to an embodiment of the disclosure, the first battery 260 and the second battery 262 may include, for example, a non-rechargeable primary cell, a rechargeable secondary cell, or a fuel cell. The first battery 260 and the second battery 262 may be integrally deployed in the housing 201 of the electronic device 200, or may be detachably deployed in the housing 201 of the electronic device 200. The first battery 260 and the second battery 262 may be configured as one pack. The first battery 260 and the second battery 262 may include different fuel gauges for grasping the capacities thereof, or may use different chargers. Through this, the batteries having different sizes can be efficiently managed. The first battery 260 and the second battery 262 may be configured as one cell.

The antenna module 270 may be deployed between the third circuit board 240 and the back cover 280. The antenna module 270 (e.g., the antenna module 197 of FIG. 1) may be connected to the third circuit board 240. The antenna module 270 may include an antenna 275 illustrated in FIG. 4. The third circuit board 240 may include a connection terminal connected to the antenna module 270.

According to an embodiment of the disclosure, the antenna module 270 may, for example, communicate with an external device or wirelessly transmit and receive the power necessary for charging. According to another embodiment of the disclosure, an antenna structure may be formed by a partial exposure surface of the housing 201 and/or a part of the support member 203 or a combination thereof.

The back cover 280 may be a cover for protecting the back surface of the electronic device 200 (e.g., the electronic device 101 of FIG. 1).

Figure 4:
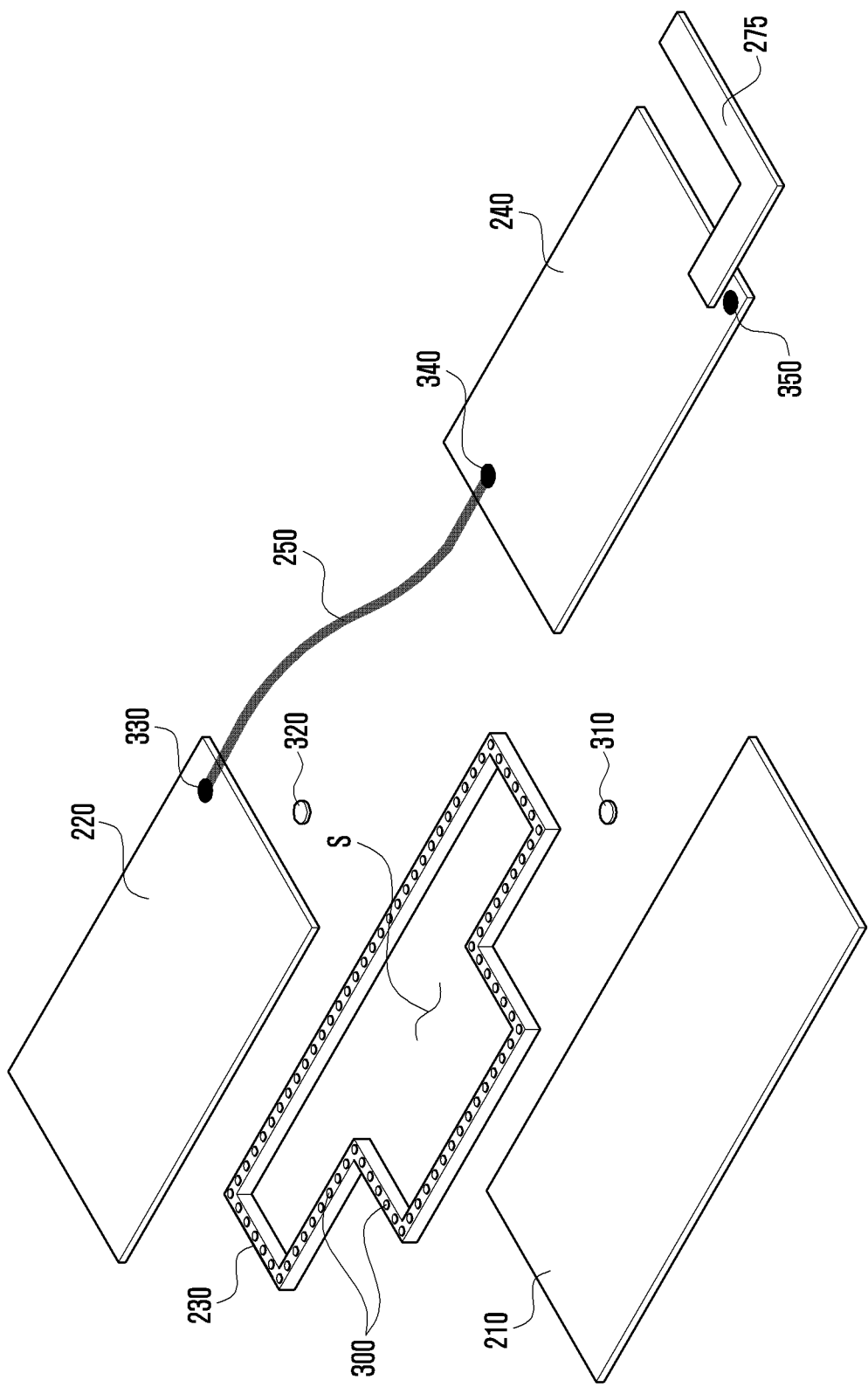
FIG. 4 is a perspective view schematically illustrating a connection relationship among first to third circuit boards of an electronic device according to various embodiments of disclosure.
Figure 5:
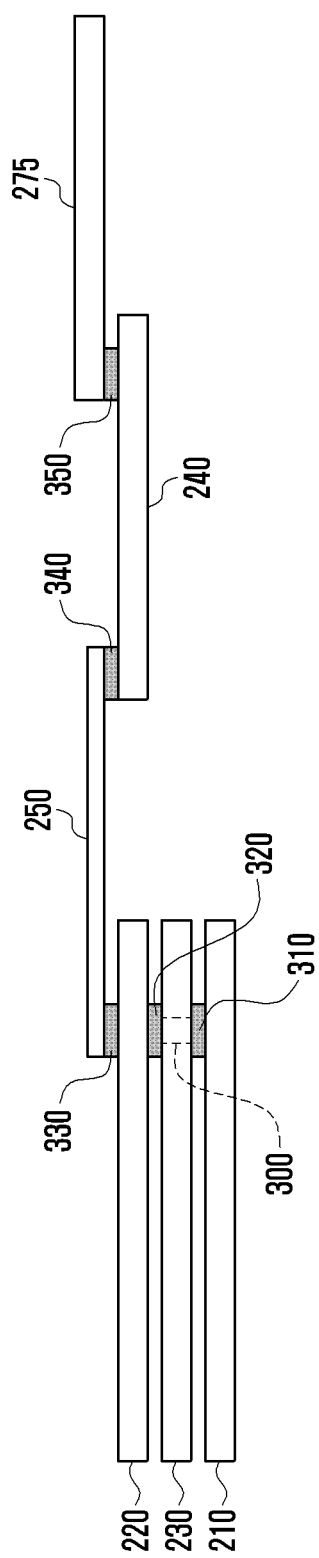
FIG. 5 is a side view schematically illustrating a connection relationship among first to third circuit boards of an electronic device according to various embodiments of the disclosure.

FIG. 4 is a perspective view schematically illustrating a connection relationship among first, second, and third circuit boards of an electronic device according to various embodiments of the disclosure, and FIG. 5 is a side view schematically illustrating a connection relationship among first, second, and third circuit boards of an electronic device according to various embodiments of the disclosure.

Referring to FIGS. 4 and 5, an electronic device 200 according to various embodiments of the disclosure may include a first circuit board 210, a second circuit board 220, an interposer 230, and a third circuit board 240.

A communication circuit (e.g., the communication module 190 of FIG. 1) may be deployed on the first circuit board 210. The communication circuit may include, for example, an AP (e.g., the AP 212 of FIG. 6) and a call processor (e.g., the call processor 214 of FIG. 6). A first connection terminal 310 electrically connected to an output of the communication circuit may be formed on a first surface (e.g., the upper portion) of the first circuit board 210.

The second circuit board 220 may include, for example, a transceiver (e.g., the transceiver 221 of FIG. 6) or a Wi-Fi module. A second connection terminal 320 may be deployed on a first surface (e.g., a lower portion) of the second circuit board 220, and a third connection terminal 330 may be deployed on a second surface (e.g., upper portion) of the second circuit board 220. The second connection terminal 320 may be electrically connected (e.g., a digital signal) to components (e.g., communication circuit) mounted on the second circuit board 220. The third connection terminal 330 may be electrically connected (e.g., an analog signal) to a fourth connection terminal 340 formed on the third circuit board 240. According to various embodiments of the disclosure, the third connection terminal 330 may be connected to the first circuit board 210 through another connection terminal (e.g., a sixth connection terminal (not illustrated)) excluding the first connection terminal 310 formed on the first circuit board 210. According to various embodiments of the disclosure, the third connection terminal 330 connected to the connector 250 may be deployed on the first circuit board 210. Through this, in case of falling of the electronic device 200, the interposer 230 can be prevented from being pressed and damaged after the back cover 280 makes an impact on a head of the connector 250. The third connection terminal 330 may be electrically connected to the first circuit board 210 through another connection member excluding the first connection terminal 310 formed on the first circuit board 210, and thus a signal can be transferred from the second circuit board 220 to the first circuit board 210 through the interposer 230 without a loss. According to an embodiment of the disclosure, for impedance matching, the interposer 230 may have different permittivity from that of the first circuit board 210 and the second circuit board 220. According to an embodiment of the disclosure, the second connection terminal 320 of the second circuit board 220 may be electrically connected to a second end portion (e.g., an upper portion) of a via 300, and the second circuit board 220 may be attached to a second surface (e.g., an upper surface) of the interposer 230 in an opposite direction to the a first surface (lower surface) of the interposer 230 so that the second circuit board 220 forms an inner space S together with the first circuit board 210 and the interposer 230.

The interposer 230 may be deployed between the first circuit board 210 and the second circuit board 220. The interposer 230 may have a space S in which at least one component mounted on the second circuit board 220 (e.g., the AP 212 of FIG. 6, call processor 214, transceiver 221, and Wi-Fi module) is deployed. The interposer 230 may be configured in a rectangular shape or in other various shapes. The interposer 230 may include at least one via 300 for electrically connecting the first connection terminal 310 formed on the first surface (e.g., an upper surface) of the first circuit board 210 and the second connection terminal 320 formed on the first surface (e.g., a lower surface) of the second circuit board 220 to each other. According to an embodiment of the disclosure, the first surface (e.g., a lower surface) of the interposer 230 may be attached to the first circuit board 210 so that the interposer 230 at least partly surrounds at least a partial region of the first circuit board 210 and the first end portion (e.g., a lower portion) of the via 300 is electrically connected to the first connection terminal 310.

The fourth connection terminal 340 may be deployed on a first side of the third circuit board 240, and a fifth connection terminal 350 may be deployed on a second side of the third circuit board 240. The fourth connection terminal 340 and the fifth connection terminal 350 may be electrically connected to each other. The fifth connection terminal 350 formed on the third circuit board 240 may be electrically connected to the antenna 275 (e.g., the antenna module 197 of FIG. 1).

According to various embodiments of the disclosure, although it is described that the third connection terminal 330 is deployed on the second circuit board 220, the third connection terminal 330 may be deployed on the first circuit board 210 as a sixth connection terminal (not illustrated). If the sixth connection terminal is deployed on the first circuit board 210, the sixth connection terminal may be electrically connected to the fourth connection terminal 340 formed on the third circuit board 240 through the connector 250. The connector 250 may be a FPCB type, coaxial type, or connector type connection member connecting the circuit boards through blocking of a radio frequency (RF) signal.

The third connection terminal 330 formed on the second surface (e.g., an upper portion) of the second circuit board 220 and the fourth connection terminal 340 formed on the first side of the third circuit board 240 may be electrically connected to each other through the connector 250. According to various embodiments of the disclosure, the third connection terminal 330 may not be limited to be formed on the second circuit board 220. For example, the third connection terminal 330 may be deployed on the first circuit board 210 so far as it can minimize a loss through impedance matching by changing the size and/or permittivity of the via 300 formed on the interposer 230.

According to various embodiments of the disclosure, the first circuit board 210 may extract raw data by decoding an in-phase signal and a quadrature signal received through a transceiver of the second circuit board 220. The second circuit board 220 may separate a RF band and may process analog data including a carrier frequency signal. The interposer 230 may transfer a baseband signal that does not include the carrier frequency signal to the first circuit board 210. The interposer 230 may process a digital signal including the in-phase signal and the quadrature signal. The connector 250 may transfer an analog signal from which the (RF band is separated to the fourth connection terminal 340 of the third circuit board 240 through the third connection terminal 330 formed on the second circuit board 220. According to various embodiments of the disclosure, the first circuit board 210 may transfer the digital signal related to the RF band to the second circuit board 220 through the interposer 230. In order to minimize a loss of the RF band, the second circuit board 220 may transfer the digital signal related to the RF band to the third circuit board 240, to which the antenna 275 is connected, other than the first circuit board 210.

According to various embodiments of the disclosure, the analog signal, from which the RF band that is electrically connected to the antenna 275 is separated, may be transferred to the first circuit board 210 through the interposer 230. For the impedance matching to minimize a loss of the analog signal from which the RF band is separated, the permittivity of the interposer 230 or the size of the via 300 may be adjusted. In this case, the analog signal from the interposer 230 may be transferred to the first circuit board 210. The transferred analog signal may be transferred to the fourth connection terminal of the third circuit board 240 through another connection terminal on the first circuit board 210.

According to various embodiments of the disclosure, in order to transfer the analog signal from which the RF band is separated to the first circuit board 210 without a loss after the impedance matching of the analog signal, the via 300 formed on the interposer 230 may be copied into the connector 250 to calculate the impedance. The impedance calculation of the connector 250 is as in mathematical Equation 1 below.

$$Z_0 = \frac{138}{\sqrt{k}} \log \frac{d_1}{d_2} \qquad \text{Equation 1}$$

$Z_0$ denotes impedance, d1 denotes an inner diameter of a shield pattern surrounding the via 300, d2 denotes an outer diameter of the via 300, and k denotes relative permittivity.

For example, if the via 300 is pierced with 0.4 phi, the impedance $Z_0$ of the connector 250 may be 26.18Ω, whereas if the via 300 is pierced with 0.2 phi, the impedance $Z_0$ of the connector 250 may be 46Ω (e.g., εr of the first circuit board 210 is εr=4.4, and d1 is an impedance value in case of 1 phi as compared with d2). In this case, the impedance $Z_0$ of the connector 250 may be controlled to approach 50Ω by changing the permittivity in case where the via 300 is pierced with 0.4 phi.

Figure 6:
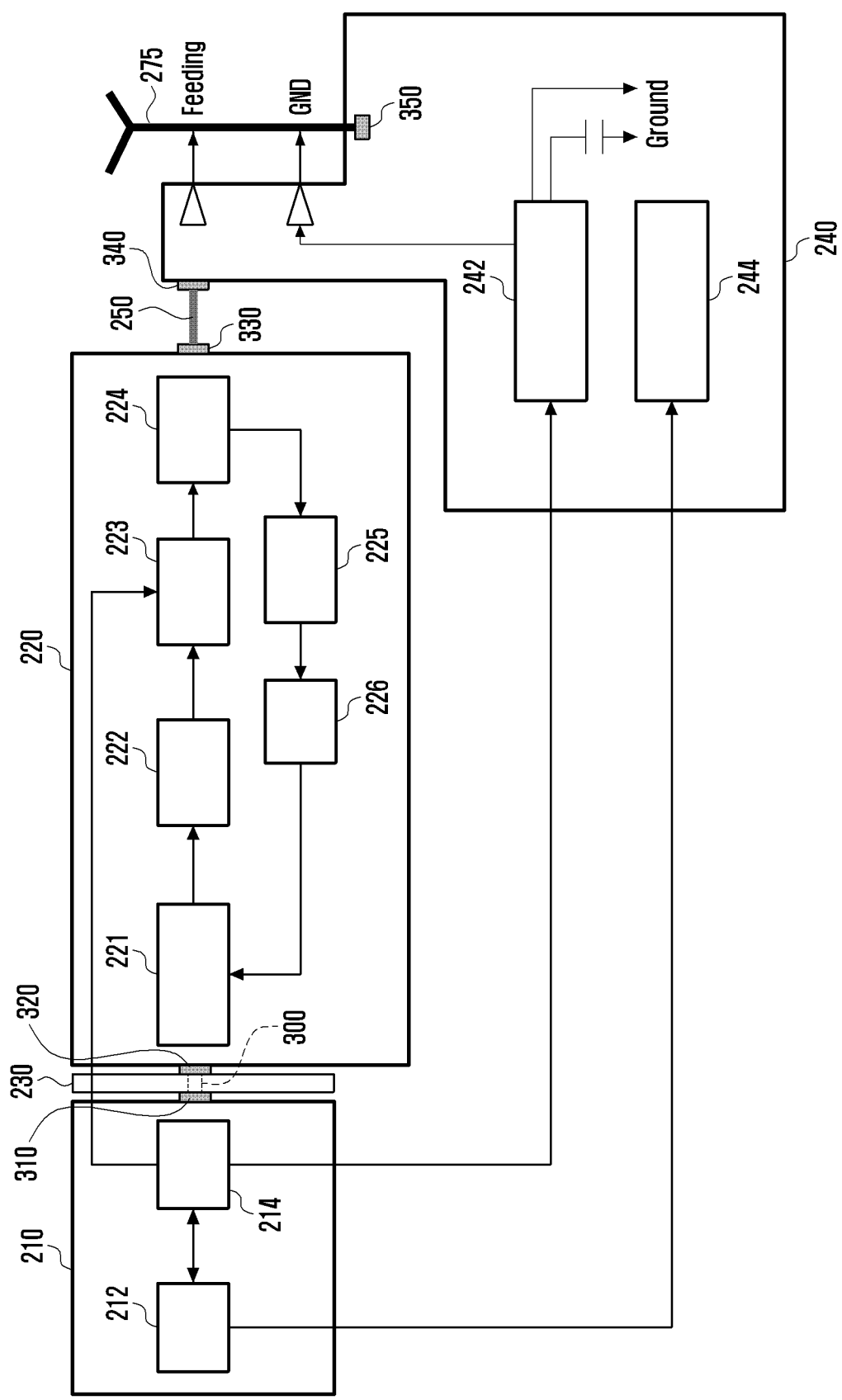
FIG. 6 is a diagram illustrating a configuration of first to third circuit boards of an electronic device and a connection relationship among them according to various embodiments of the disclosure.

FIG. 6 is a diagram illustrating a configuration of first to third circuit boards of an electronic device and a connection relationship among them according to various embodiments of the disclosure.

Referring to FIG. 6, an electronic device 200 according to various embodiments of the disclosure may include a first circuit board 210, a second circuit board 220, an interposer 230, and a third circuit board 240.

The first circuit board 210 may include, for example, an AP 212, and a call processor 214. The first circuit board 210 may include a first connection terminal 310 on a first surface thereof.

According to an embodiment of the disclosure, the AP 212 may control functions of constituent elements (e.g., the processor 120, the memory 130, the communication module 190, and the power management module 188 of FIG. 1) required to operate the electronic device 200. The call processor 214 may modulate and demodulate a signal related to a communication protocol of the electronic device 200.

The second circuit board 220 may include a transceiver 221, a first filter 222, a power amplifier 223, a switch 224, a second filter 225, and a low-noise amplifier 226. A second connection terminal 320 may be deployed on a first surface of the second circuit board 220, and a third connection terminal 330 may be deployed on a second surface of the second circuit board 220. The second connection terminal 320 and the third connection terminal 330 may be electrically connected to each other through another component.

According to an embodiment of the disclosure, the transceiver 221 may mix a signal modulated through the call processor 214 of the first circuit board 210 with a carrier frequency signal through a mixer to transmit (Tx) the mixed signal, or may separate the receive (Rx) demodulated signal from the carrier frequency signal to modulate the separated signal. The first filter 222 may perform matching of the signal transferred from the transceiver 221, or may perform filtering of a noise signal from the carrier frequency signal. The power amplifier 223 may amplify the transmit (Tx) signal filtered through the first filter 222 to increase a current gain of the signal. The switch 224 may separate paths of the transmit (Tx) signal and the receive (Rx) signal from each other. The second filter 225 may perform filtering of the noise signal from the receive (Rx) signal transferred through the switch 224. For example, the low-noise amplifier 226 may amplify the receive (Rx) signal transferred through the second filter 225, and may transfer the amplified signal to the transceiver 221.

The interposer 230 may be deployed between the first circuit board 210 and the second circuit board 220. The interposer 230 may include the via 300 for electrically connecting the first connection terminal 310 formed on the first surface of the first circuit board 210 and the second connection terminal 320 formed on the first surface of the second circuit board 220 to each other.

The third circuit board 240 may include a matching switch 242 controlled through the call processor 214 mounted on the first circuit board 210 and a hall integrated circuit (IC) 244 controlled through the AP 212. According to various embodiments of the disclosure, a control signal provided by the AP 212 and the CP 214 mounted on the first circuit board 210 may be transferred to a separate connection member (e.g., a connector FPCB) electrically connecting the first circuit board 210 and the third circuit board 240 to each other. A fourth connection terminal 340 may be deployed on a first side of the third circuit board 240, and a fifth connection terminal 350 may be deployed on a second side of the third circuit board 240. The fourth connection terminal 340 and the fifth connection terminal 350 may be electrically connected to each other. The fifth connection terminal 350 formed on the third circuit board 240 may be electrically connected to the antenna 275.

According to an embodiment of the disclosure, the matching switch 242 may adjust matching of ground (GND) or feeding of the antenna 275 connected to the fifth connection terminal 350 of the third circuit board 240. The hall IC 244 may recognize, for example, opening or closing of a mobile terminal having a cover (e.g., a folder phone). The antenna 275 may transmit and receive a transmit (Tx) signal and a receive (Rx) signal for a specific wavelength.

According to an embodiment of the disclosure, the third connection terminal 330 formed on the second surface of the second circuit board 220 and the fourth connection terminal 340 formed on the first side of the third circuit board 240 may be electrically connected to each other through the connector 250.

Figure 7:
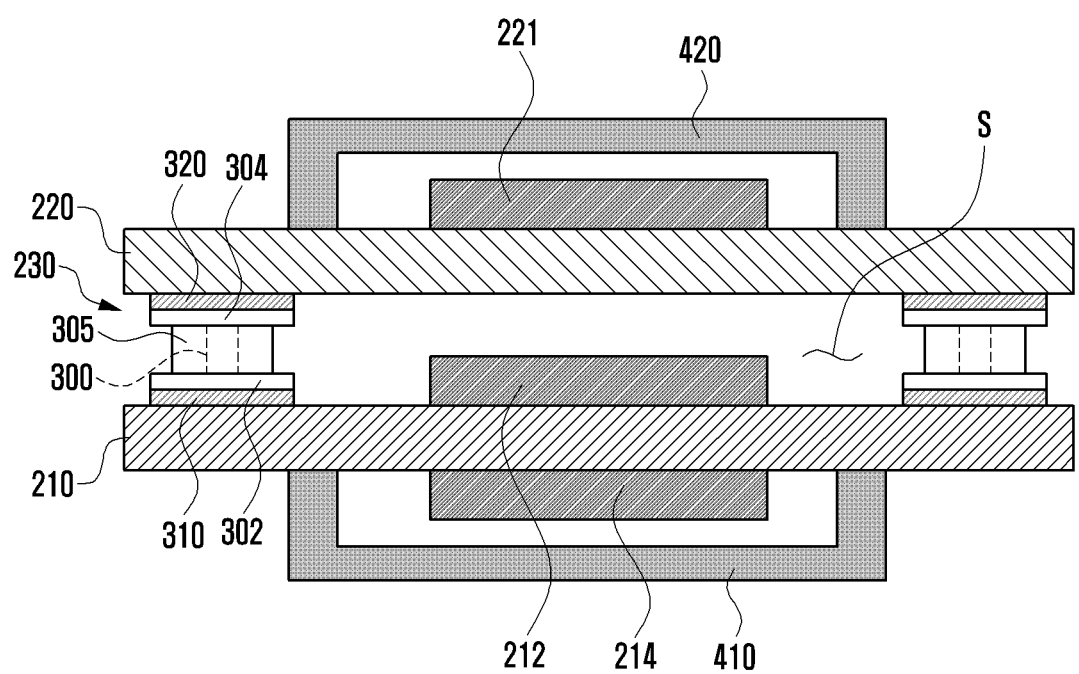
FIG. 7 is a view illustrating a configuration of first and second circuit boards of an electronic device according to various embodiments of the disclosure.

FIG. 7 is a view illustrating a configuration of first and second circuit boards of an electronic device according to various embodiments of the disclosure.

Referring to FIG. 7, an electronic device 200 according to various embodiments of the disclosure may include a first circuit board 210, a second circuit board 220, an interposer 230, a first shield member 410, and a second shield member 420.

On a lower portion of the first circuit board 210, for example, an AP 212 may be mounted. The first shield member 410 may be deployed on an outside of the AP 212 mounted on the lower portion of the first circuit board 210. The first shield member 410 may block, for example, a noise signal output from the first circuit board 210 of the electronic device 200, and may block noise input from an outside of the electronic device 200. The first shield member 410 may be a shield can or electromagnetic interference (EMI) molding member.

On an upper portion of the first circuit board 210, for example, the CP 214 may be mounted. The CP 214 mounted on the upper portion of the first circuit board 210 may be deployed in a component mount space S in the interposer 230. A first connection terminal 310 may be deployed on the first surface (e.g., an upper portion) of the first circuit board 210. A second connection terminal 320 may be deployed on the first surface (e.g., a lower portion) of the second circuit board 220.

According to an embodiment of the disclosure, the interposer 230 may include a via 300, a first pad 302, a second pad 304, and a side plating member 305.

The via 300 may electrically connect the first connection terminal 310 formed on the first circuit board 210 and the second connection terminal 320 formed on the second circuit board 220 to each other. The via 300 may include a through via or a stacked via.

The first pad 302 may be formed on a lower portion of the via 300 and may be electrically connected to the first connection terminal 310 of the first circuit board 210.

The second pad 304 may be formed on an upper portion of the via 300 and may be electrically connected to the second connection terminal 320 of the second circuit board 220.

The side plating member 305 may be provided on an outside of the via 300. The side plating member 305 may combine the first circuit board 210 and the second circuit board 220 with each other (e.g., may be electrically connected to the first circuit board 210 or the second circuit board 220), or may support them (may not be electrically connected to the first circuit board 210 or the second circuit board 220). The side plating member 305 may be selectively used.

On an upper portion of the second circuit board 220, for example, a transceiver 221 may be mounted. The second shield member 420 may be deployed on an outside of the transceiver 221 mounted on the upper portion of the second circuit board 220. The second shield member 420 may block, for example, a noise signal output from the second circuit board 220 of the electronic device 200, and may block noise input from an outside of the electronic device 200. The second shield member 420 may be a shield can or EMI molding member.

According to an embodiment of the disclosure, the EMI molding members of the first shield member 410 and the second shield member 420 may be respectively combined with the first circuit board 210 and the second circuit board 220 through the following process.

In a first process, a pad for shield may be formed on at least a part of the lower portion of the first circuit board 210 and on at least a part of the upper portion of the second circuit board 220.

In a second process, the first shield member 410 and the second shield member 420 may be mounted on the pad for shield formed on at least the part of the lower portion of the first circuit board 210 and on at least the part of the upper portion of the second circuit board 220.

In a third process, after the first shield member 410 and the second shield member 420 are mounted through the second process, non-conductive molding liquid (e.g., epoxy molding compound (EMC)) may be spread.

In a fourth process, the non-conductive molding liquid spread around the pad for shield on which the first shield member 410 and the second shield member 420 are mounted may be etched through laser.

In a fifth process, sputtering of a conductive metal may be performed with respect to the pad for shield and the non-conductive molding liquid.

Figure 8:
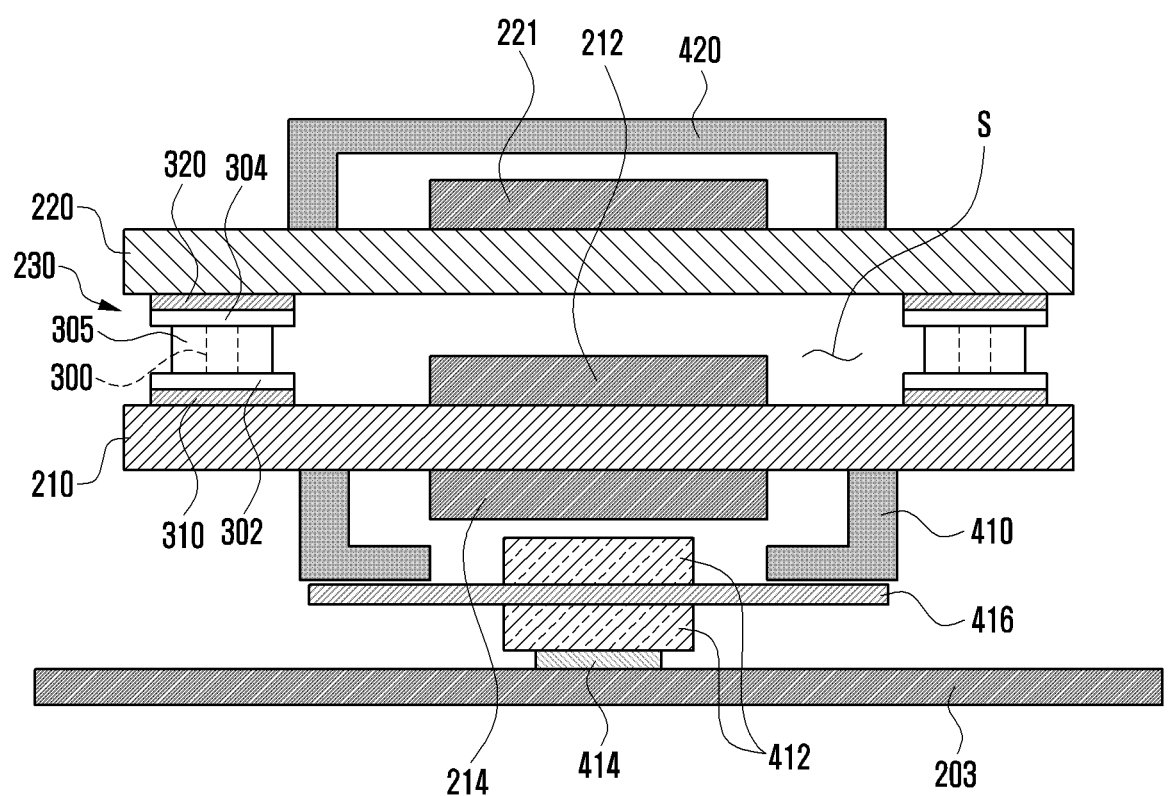
FIG. 8 is a view illustrating a configuration of first and second circuit boards of an electronic device according to various embodiments of the disclosure.

FIG. 8 is a view illustrating a configuration of first and second circuit boards of an electronic device according to various embodiments of the disclosure.

Referring to FIG. 8, an electronic device 200 according to various embodiments of the disclosure may include a first circuit board 210, a second circuit board 220, an interposer 230, a first shield member 410, a TIM 412, a heat dissipation member 414, a copper sheet 416, and a second shield member 420.

On a lower portion of the first circuit board 210, for example, an AP 212 may be mounted. The first shield member 410 may be deployed on an outside of the AP 212 mounted on the lower portion of the first circuit board 210. The first shield member 410 may block, for example, a noise signal output from the first circuit board 210 of the electronic device 200, and may block noise input from an outside of the electronic device 200. The first shield member 410 may be a shield can or EMI molding member.

According to an embodiment of the disclosure, at least a part of the first shield member 410 may be opened. A first end of the thermal interface material (TIM) 412 may be deployed adjacent to the AP 212, and a second end thereof may be provided to penetrate the open part of the first shield member 410. The TIM 412 may serve to transfer heat generated from the call processor 214 of the electronic device 200 to the heat dissipation member 414. For example, the TIM 412 may be made of a material having a large heat transfer coefficient. The copper sheet 416 may be provided between the first end and the second end of the TIM 412. The copper sheet 416 may close the open part of the first shield member 410. The copper sheet 416 may block the noise generated inside the electronic device 200. The heat dissipation member 414 may be deployed on a support member (e.g., a bracket) 203. The heat dissipation member 414 may transfer the heat transferred through the TIM 412 to the support member 203, and may dissipate the heat to outside through the support member 203.

On an upper portion of the first circuit board 210, for example, the call processor 214 may be mounted. The call processor 214 mounted on the upper portion of the first circuit board 210 may be deployed in a component mount space S in the interposer 230. A first connection terminal 310 may be deployed on the first surface (e.g., an upper portion) of the first circuit board 210. A second connection terminal 320 may be deployed on the first surface (e.g., a lower portion) of the second circuit board 220.

According to an embodiment of the disclosure, the interposer 230 may include a via 300, a first pad 302, a second pad 304, and a side plating member 305.

The via 300 may electrically connect the first connection terminal 310 formed on the first circuit board 210 and the second connection terminal 320 formed on the second circuit board 220 to each other. The via 300 may include a through via or a stacked via.

The first pad 302 may be formed on a lower portion of the via 300 and may be electrically connected to the first connection terminal 310 of the first circuit board 210.

The second pad 304 may be formed on an upper portion of the via 300 and may be electrically connected to the second connection terminal 320 of the second circuit board 220.

The side plating member 305 may be provided on an outside of the via 300. The side plating member 305 may combine the first circuit board 210 and the second circuit board 220 with each other, or may support them. The side plating member 305 may be selectively used.

On an upper portion of the second circuit board 220, for example, a transceiver 221 may be mounted. The second shield member 420 may be deployed on an outside of the transceiver 221 mounted on the upper portion of the second circuit board 220. The second shield member 420 may block, for example, a noise signal output from the second circuit board 220 of the electronic device 200, and may block noise input from an outside of the electronic device 200. The second shield member 420 may be a shield can or EMI molding member.

Figure 9:
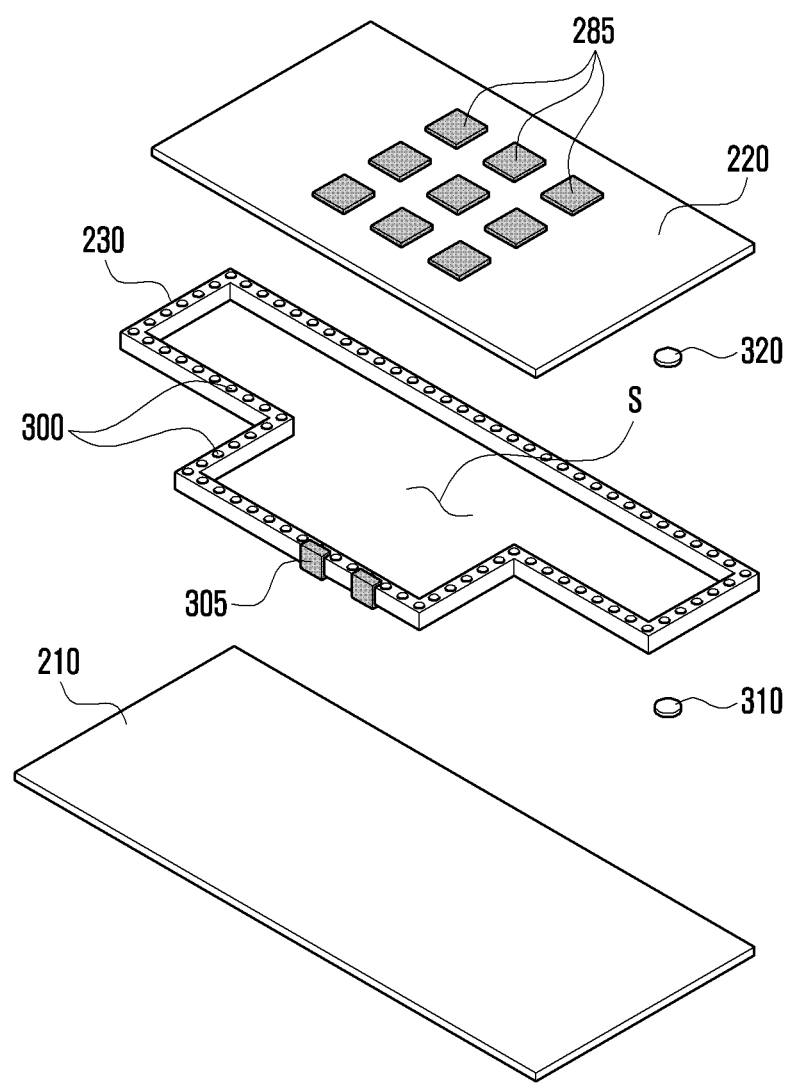
FIG. 9 is a perspective view schematically illustrating a connection relationship between first and second circuit boards of an electronic device according to various embodiments of the disclosure.
Figure 10:
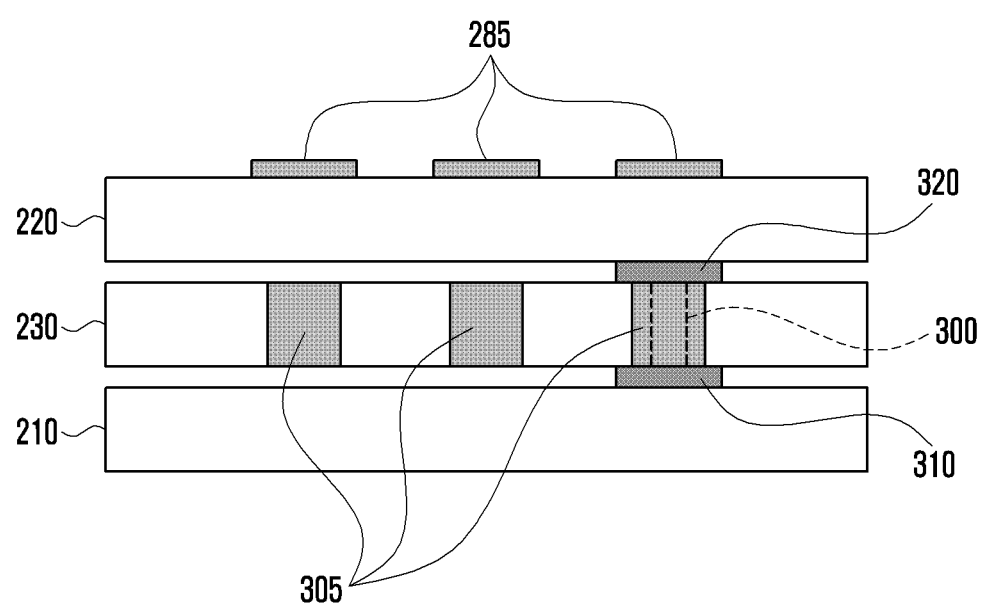
FIG. 10 is a side view schematically illustrating a connection relationship between first and second circuit boards of an electronic device according to various embodiments of the disclosure.

FIG. 9 is a perspective view schematically illustrating a connection relationship between first and second circuit boards of an electronic device according to various embodiments of the disclosure, and FIG. 10 is a side view schematically illustrating a connection relationship between first and second circuit boards of an electronic device according to various embodiments of the disclosure.

Referring to FIGS. 9 and 10, an electronic device 200 according to various embodiments of the disclosure may include a first circuit board 210, a second circuit board 220, and an interposer 230.

A communication circuit (e.g., 5G RF module) may be deployed on the first circuit board 210. A first connection terminal 310 electrically connected to an output of the communication circuit may be formed on a first surface (e.g., an upper portion) of the first circuit board 210.

On an upper portion of the second circuit board 220, for example, an array antenna 285 (e.g., an antenna module 197 of FIG. 1) may be arranged. A second connection terminal 320 may be deployed on a first surface (e.g., a lower portion) of the second circuit board 220. The array antenna 285 and the second connection terminal 320 may be electrically connected to each other. In order to lower the height of the electronic device 200, electronic components may be mounted only on one surface of the second circuit board 220. According to an embodiment of the disclosure, a third connection terminal (e.g., a third connection terminal 330 of FIG. 4) or a c clip that can electrically connect another antenna element may be deployed on a second surface (e.g., an upper portion) of the second circuit board 220.

According to various embodiments of the disclosure, the array antenna 285 may be at least one antenna patterned on the second circuit board 220 or a connection member connected to the antenna (e.g., the antenna 275 of FIG. 4). For example, as illustrated in FIG. 4, a third circuit board 240 to which the antenna 275 is connected may not be provided.

The interposer 230 may be deployed between the first circuit board 210 and the second circuit board 220. The interposer 230 may have a space S in which at least one component (e.g., 5G RF module) mounted on the first circuit board 210 is deployed. The interposer 230 may be configured in a rectangular shape or in other various shapes. The interposer 230 may include at least one via 300 for electrically connecting the first connection terminal 310 formed on the first surface (e.g., an upper surface) of the first circuit board 210 and the second connection terminal 320 formed on the first surface (e.g., a lower surface) of the second circuit board 220 to each other.

According to an embodiment of the disclosure, as illustrated in FIGS. 9 and 10, the electronic device 200 according to various embodiments of the disclosure may be configured to be able to perform 3D beamforming. For example, in order to implement the 5G RF array antenna, the second circuit board 220 may include the array antenna 285. Further, the interposer 230 may include at least one side plating member 305 provided on the side surface thereof. The side plating member 305 may be connected to the array antenna 285. The side plating member 305 may operate as a part of the array antenna 285. The side plating member 305 may cover three surfaces (e.g., upper, side, and back surfaces) of the interposer 230. The side plating member 305 may be in a " ⊏ " shape.

According to various embodiments of the disclosure, as illustrated in FIGS. 9 and 10, the electronic device 200 according to various embodiments of the disclosure may be configured to transfer an RF signal to the third circuit board 240 through the third connection terminal (e.g., the third connection terminal 330 of FIG. 4) after mounting a Wi-Fi module on the second circuit board 220, or to directly connect the antenna (e.g., the antenna 275 of FIG. 4) through an antenna connection terminal (fifth connection terminal 350 of FIG. 4 or c clip) formed on the second circuit board 220 without transferring the RF signal to the third circuit board 240. For example, the AP 212 mounted on the first circuit board 210 may transfer a digital signal for controlling the Wi-Fi module mounted on the second circuit board 220 to the second circuit board 220 through the via 300 of the interposer 230, and the Wi-Fi module on the second circuit board 220 may modulate the digital signal and may directly transfer the RF signal through the antenna 275 that is not the third circuit board 240 through the antenna connection terminal (fifth connection terminal 350 of FIG. 4 or c clip).

Figure 11:
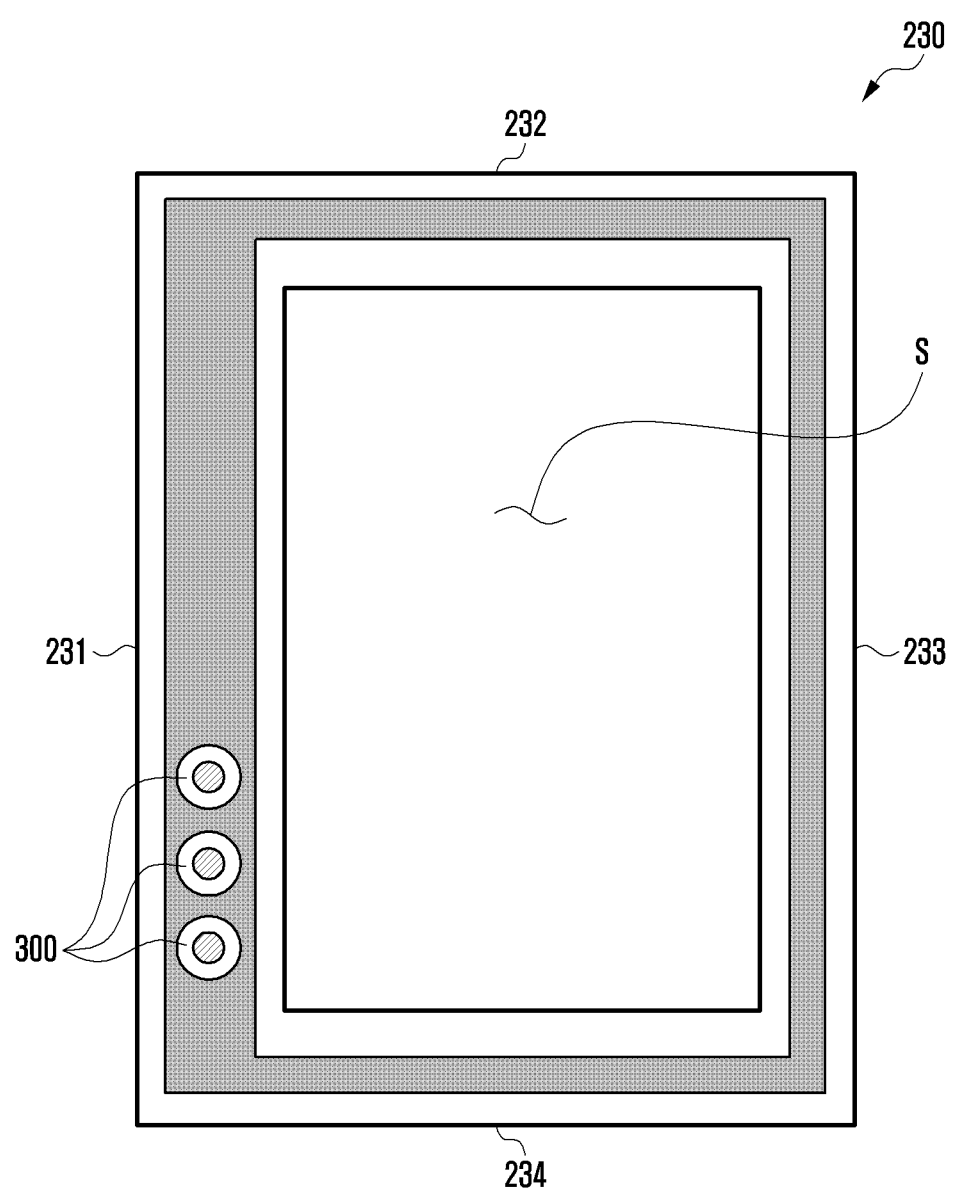
FIGS. 11 and 12 are views illustrating embodiments of an interposer of an electronic device according to various embodiments of the disclosure.
Figure 12:
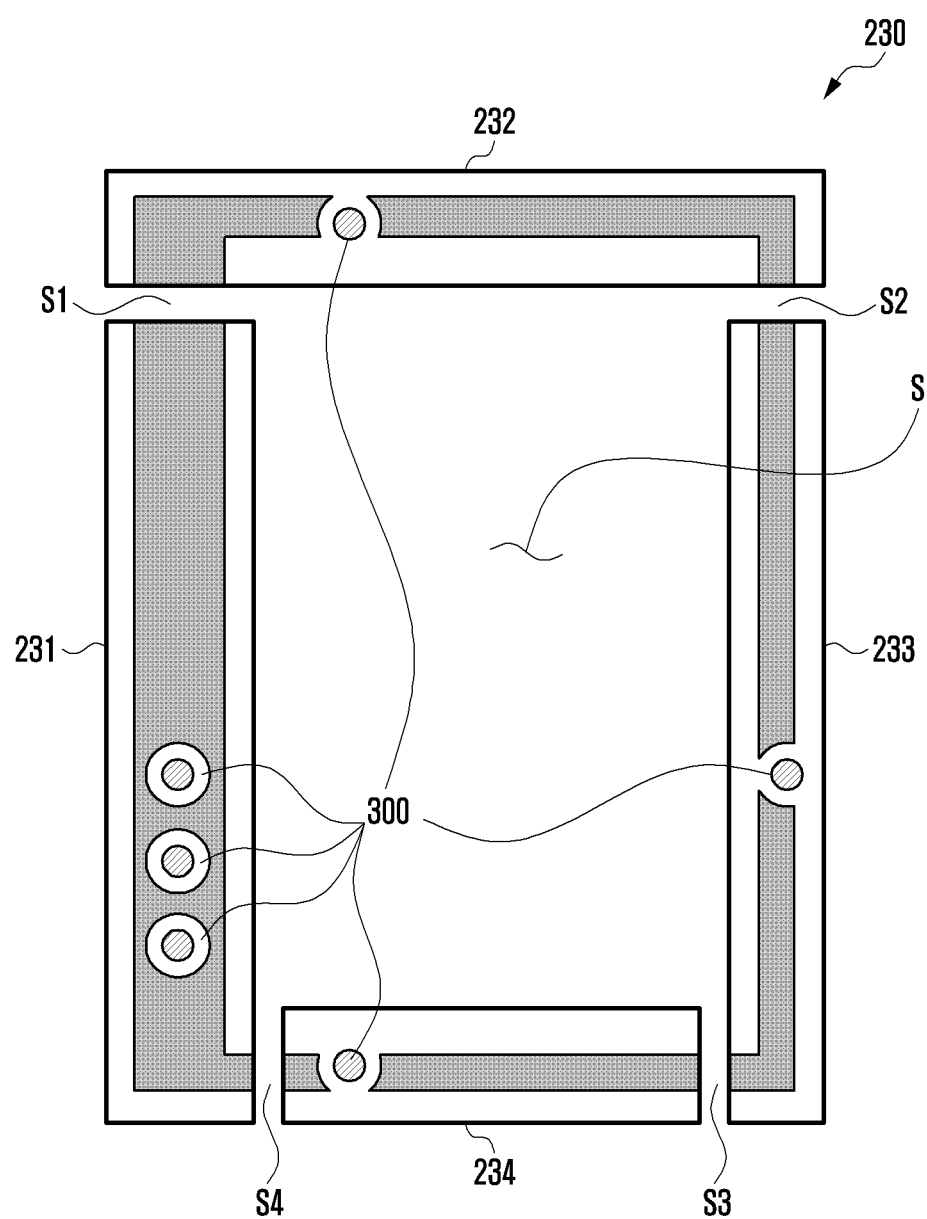

FIGS. 11 and 12 are views illustrating embodiments of an interposer of an electronic device according to various embodiments of the disclosure.

Referring to FIG. 11, an interposer 230 of an electronic device 200 according to various embodiments of the disclosure may be composed of a first portion 231 having vias 300 formed thereon, a second portion 232, a third portion 233, and a fourth portion 234, which are integrally connected to each other. Even if the interposer 230 is configured in various different shapes, all portions constituting the interposer 230 may be integrally connected to each other. The interposer 230 may include a space S in which at least one component (e.g., the AP 212, call processor 214, or transceiver 221) mounted on the second circuit board 220 is deployed.

Referring to FIG. 12, an electronic device 200 according to various embodiments of the disclosure may be provided with at least one interposer 230. According to an embodiment of the disclosure, the interposer 230 may include a first portion (e.g., first interposer) 231 having vias 300 formed thereon, a second portion (e.g., first interposer) 232, a third portion (e.g., first interposer) 233, and a fourth portion (e.g., first interposer) 234, which can be separated from each other through first to fourth slits s1 to s4. For example, the first portion 231 and the second portion 232 may be separated from each other by the first slit s1. The second portion 232 and the third portion 233 may be separated from each other by the second slit s2. The third portion 233 and the fourth portion 234 may be separated from each other by the third slit s3. The fourth portion 234 and the first portion 231 may be separated from each other by the fourth slit s4. Even if the interposer 230 is configured in various different shapes, all portions constituting the interposer 230 may be configured to be separated from each other. According to an embodiment of the disclosure, the first to fourth slits s1 to s4 may be configured enough to prevent inflow of a noise signal from outside. For example, the first to fourth slits s1 to s4 may be configured at an interval that is smaller than the electrical wavelength of the noise signal from the outside. According to an embodiment of the disclosure, in order to block the inflow of the noise signal through the first to fourth slits s1 to s4, the interposer 230 may further include a shield member for shielding partial components in an inner space S. The shield member may be a shield can or EMI molding member.

Figure 13:
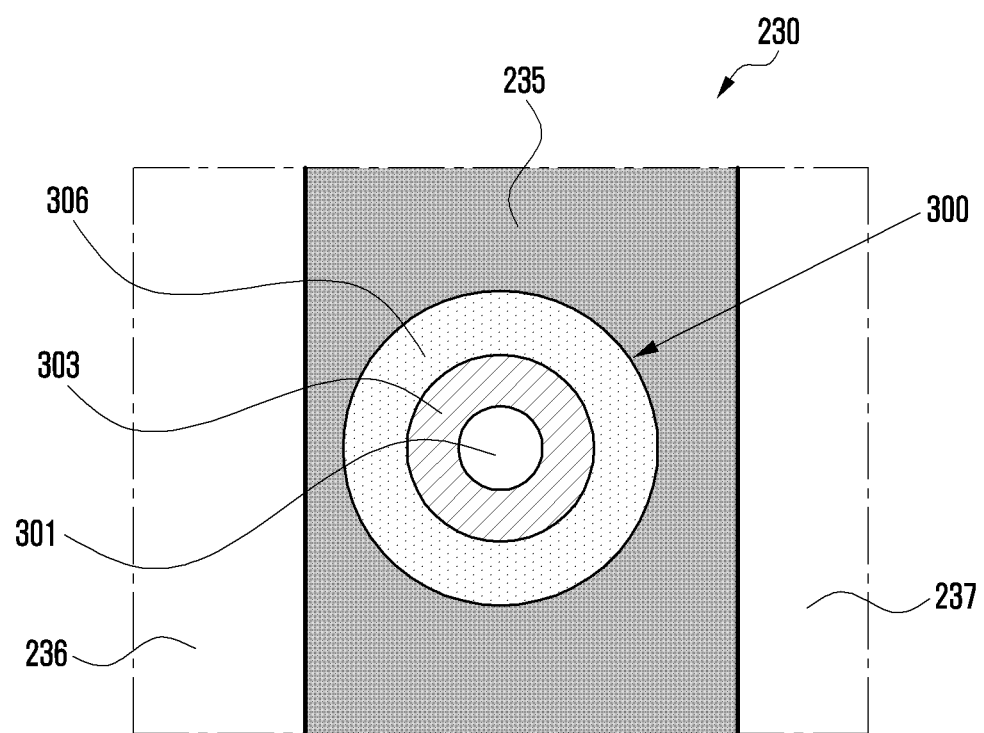
FIG. 13 is a view illustrating a via and an interposer of an electronic device according to various embodiments of the disclosure.

FIG. 13 is a view illustrating a via and an interposer of an electronic device according to various embodiments of the disclosure.

Referring to FIG. 13, a via 300 of an electronic device 200 according to various embodiments of the disclosure may be composed of a through via. The via (e.g., through via) 300 may include a hole 301, a plating pad 303, and an insulation region 306.

The hole 301 may be formed to penetrate, for example, at least a part of an interposer 230 through a drill. An inner wall of the hole 301 may be plated to transfer an electrical signal.

The plating pad 303 (e.g., the first pad 302 or second pad 304 of FIG. 7) may be formed to surround an outer side of the hole 301. The plating pad 303 may be composed of a copper film and a gold film. The gold film may correspond to gold plating performed to prevent corrosion of the copper film.

The insulation region 306 may be formed to surround an outer side of the plating pad 303. The insulation region 306 may be, for example, a region in which the copper film is opened so that the plating pad 303 of the via 300 is not connected to another signal (e.g., a ground region 235) of the interposer 230. Only solder resist (SR) ink may be spread on the region in which the copper film is open.

Referring to FIG. 13, the interposer 230 of the electronic device 200 according to various embodiments of the disclosure may include a ground region 235, a first keep-out region 236, and a second keep-out region 237.

The ground region 235 may surround or may be electrically connected to at least a part (e.g., the insulation region 306) of the via 300. The ground region 235 may be composed of a copper film and SR ink. The SR ink may be ink spread to prevent corrosion of the copper film.

The first keep-out region 236 may be formed on the first side of the ground region 235. The second keep-out region 237 may be formed on the second side of the ground region 235. For example, the first keep-out region 236 and the second keep-out region 237 may be formed on both sides of the ground region 235. The first keep-out region 236 or the second keep-out region 237 may be a region in which an interconnect formed based on an error that is necessary for routing to cut an outline of the interposer 230 in a desired shape does not exist.

Figure 14:
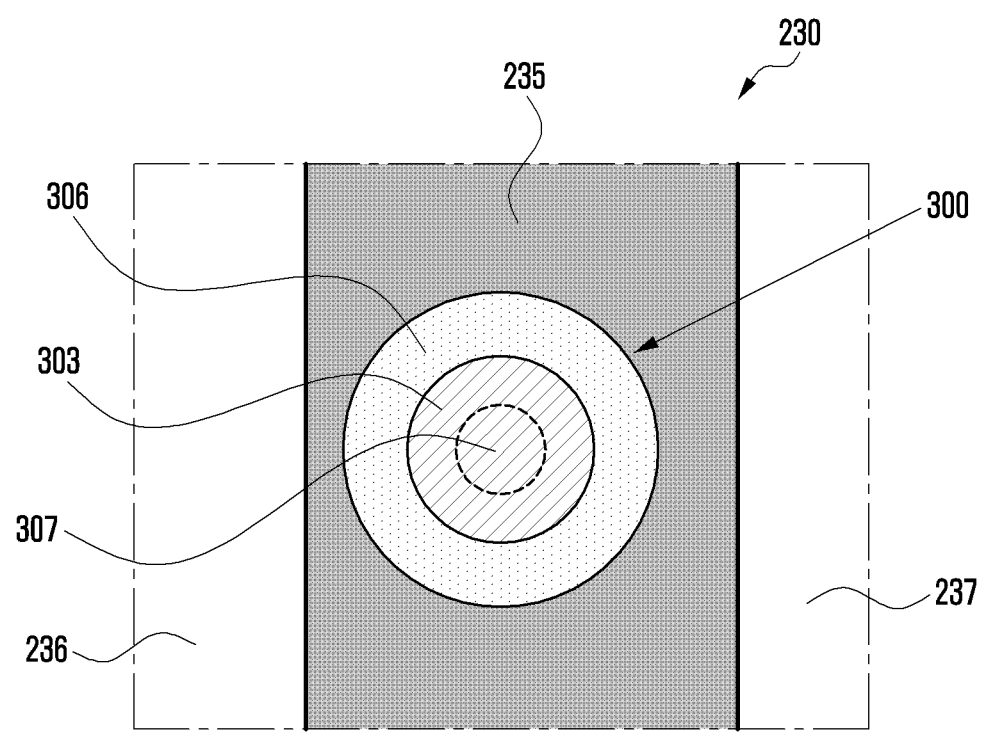
FIG. 14 is a view illustrating a via and an interposer of an electronic device according to various embodiments of the disclosure.

FIG. 14 is a view illustrating a via and an interposer of an electronic device according to various embodiments of the disclosure.

Referring to FIG. 14, a via 300 of an electronic device 200 according to various embodiments of the disclosure may be composed of a tacked via. The via (e.g., stacked via) 300 may include an inner via 307, a plating pad 303, and an insulation region 306.

The inner via 307 may be formed to be smaller than the plating pad 303 (e.g., the first pad 302 or second pad 304 of FIG. 7) for high-speed signal movement.

The plating pad 303 may surround an outer side of the inner via 307. The plating pad 303 may close an end portion of the inner via 307. The plating pad 303 may be composed of a copper film and a gold film. The gold film may correspond to gold plating performed to prevent corrosion of the copper film.

The insulation region 306 may be formed to surround an outer side of the plating pad 303. The insulation region 306 may be, for example, a region in which the copper film is opened so that the plating pad 303 of the via 300 is not connected to another signal (e.g., the ground region 235) of the interposer 230. Only SR ink may be spread on the region in which the copper film is open.

Referring to FIG. 14, the interposer 230 of the electronic device 200 according to various embodiments of the disclosure may include a ground region 235, a first keep-out region 236, and a second keep-out region 237. The interposer 230 illustrated in FIG. 14 may have the same configuration as the configuration of the interposer 230 illustrated in FIG. 13.

Figure 15:
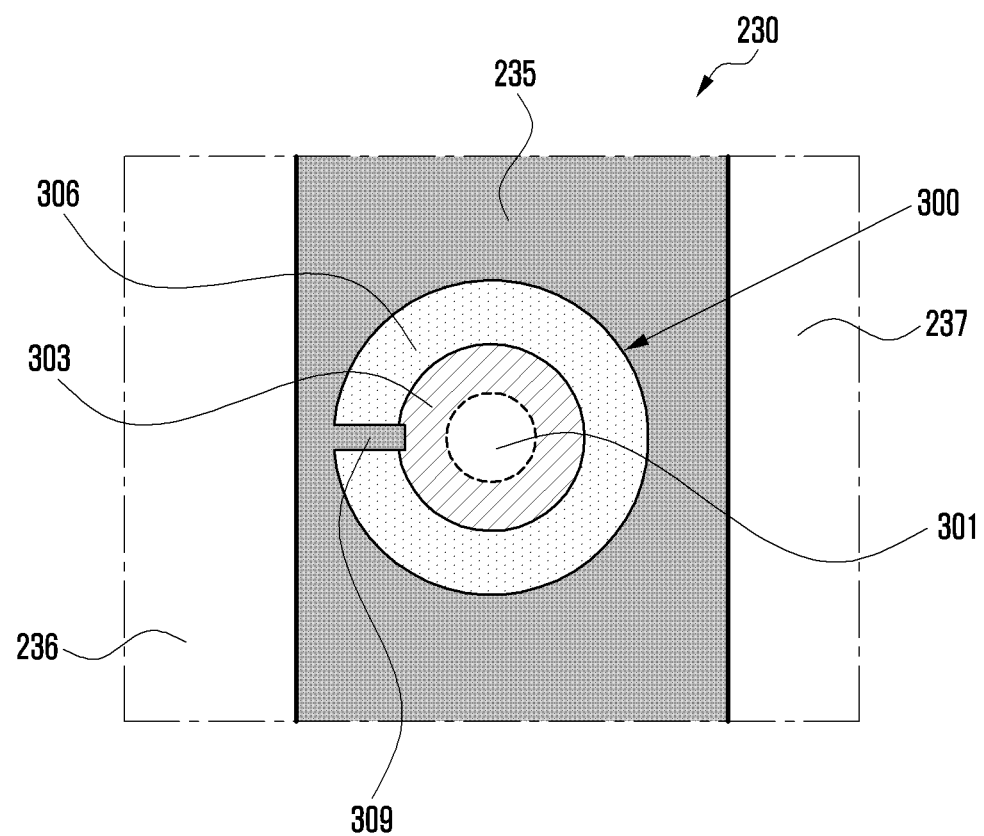
FIG. 15 is a view illustrating a via and an interposer of an electronic device according to various embodiments of the disclosure.

FIG. 15 is a view illustrating a via and an interposer of an electronic device according to various embodiments of the disclosure.

Referring to FIG. 15, a via 300 of an electronic device 200 according to various embodiments of the disclosure may be composed of a through via. The via (e.g., through via) 300 may include a hole 301, a plating pad 303, and an insulation region 306.

The via 300 illustrated in FIG. 15 may have the same configuration as the configuration of the via 300 illustrated in FIG. 13.

The interposer 230 illustrated in FIG. 15 may have the same configuration as the configuration of the interposer 230 illustrated in FIG. 13.

The configuration illustrated in FIG. 15 is different from the configuration illustrated in FIG. 13 on the point that the ground region 235 of the interposer 230 and the plating pad of the via 300 can be connected to each other using an interconnect 309.

Figure 16:
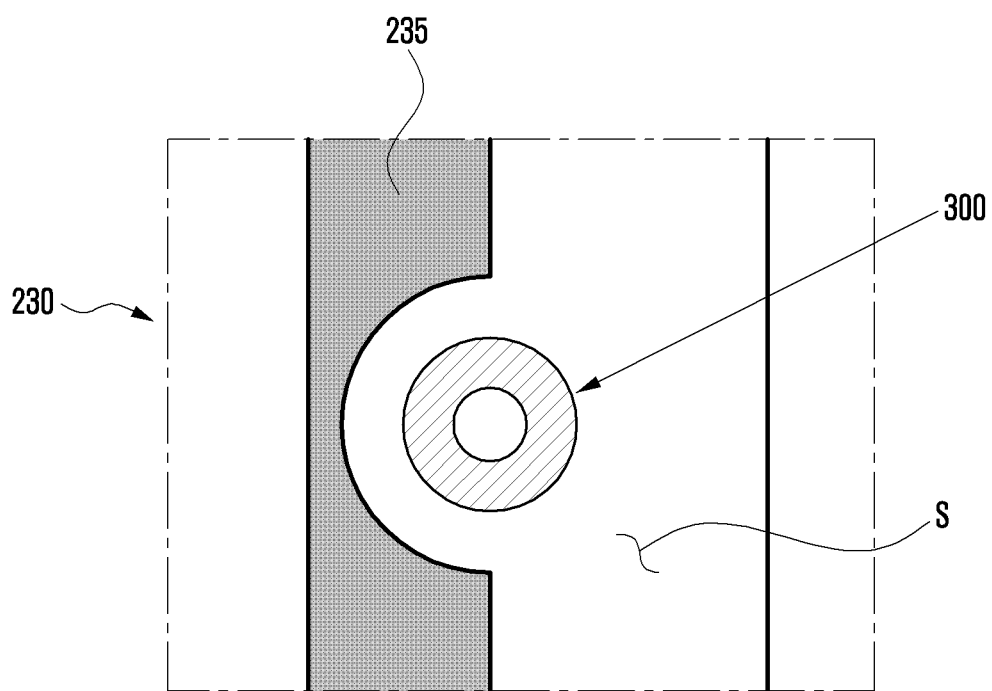
FIG. 16 is a view illustrating a configuration of an interposer of an electronic device according to various embodiments of the disclosure.

FIG. 16 is a view illustrating a configuration of an interposer of an electronic device according to various embodiments of the disclosure.

Referring to FIG. 16, an interposer 230 of an electronic device 200 according to various embodiments of the disclosure may be configured so that a part (e.g., an inner side) of a ground region 235 is removed, and the width of the interposer 230 is reduced as much as the removed ground region 235.

Figure 17:
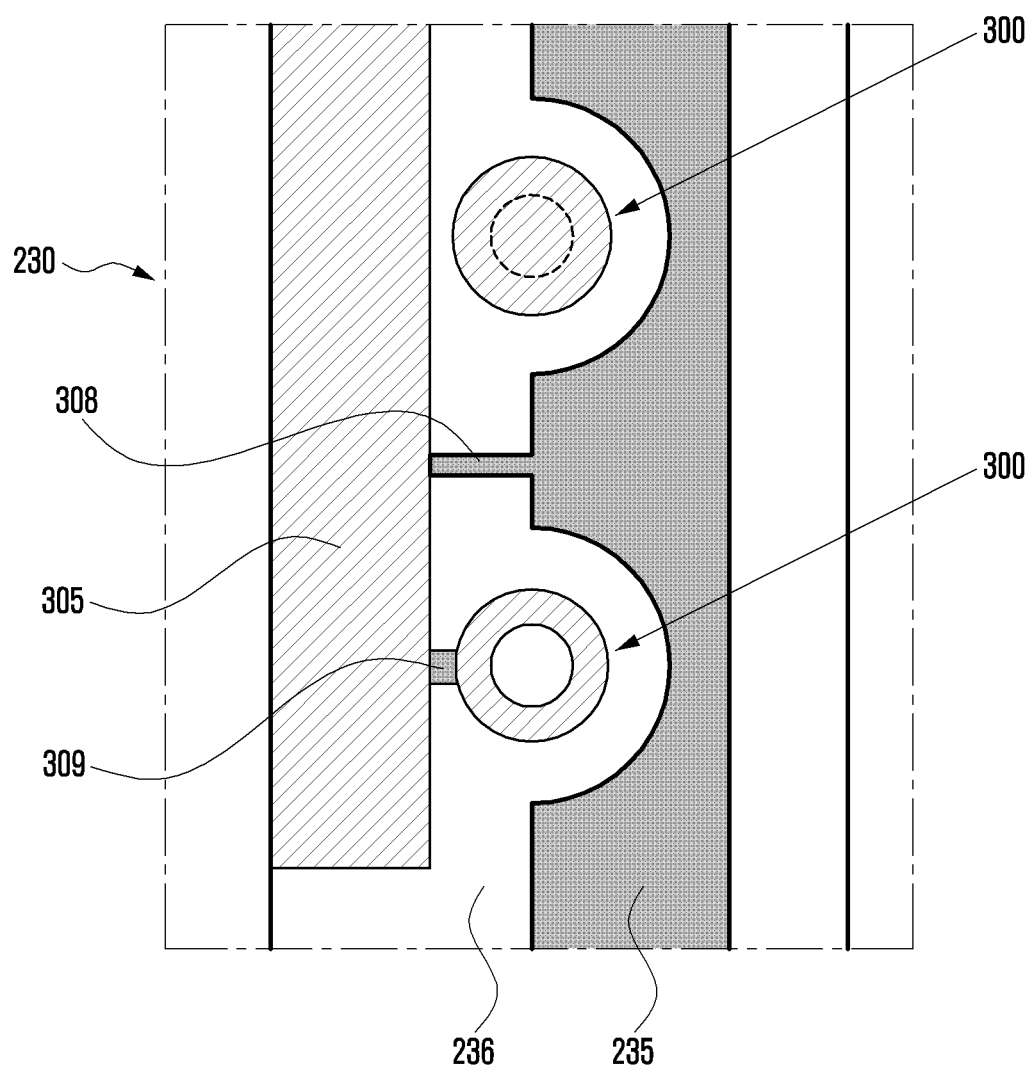
FIG. 17 is a view illustrating a configuration of an interposer of an electronic device according to various embodiments of the disclosure.

FIG. 17 is a view illustrating a configuration of an interposer of an electronic device according to various embodiments of the disclosure.

Referring to FIG. 17, an interposer 230 of an electronic device 200 according to various embodiments of the disclosure may include different vias (e.g., stacked via and through via) 300. The interposer 230 may be configured so that a part (e.g., an outer side) of a ground region 235 is removed, and a side plating member 305 is deployed in the removed region and a first keep-out region 236. The side plating member 305 may cover three surfaces (e.g., upper, side, and back surfaces) of the interposer 230. The side plating member 305 may be in a "⊏" shape. According to another embodiment of the disclosure, the interposer 230 may be configured so that a part (e.g., an inner side) of the ground region 235 is removed, and the side plating member 305 is deployed in the removed region and a second keep-out region 237. The first and second keep-out regions 236 and 237 may be regions in which an interconnect formed based on an error that is necessary for routing to cut an outline of the interposer 230 in a desired shape does not exist. Accordingly, after the routing, the side plating member 305 is formed in the first and second keep-out regions 236 and 237 through a separate addition process (e.g., drilling, copper plating, and gold plating in the first and second keep-out regions 236 and 237 of the side surface of the interposer 230 after the routing), and thus the existing unused space can be utilized. Through this, the width of the interposer 230 can be reduced as large as a part of the width of the removed ground region 235.

According to an embodiment of the disclosure, the side plating members deployed on the outer side and the inner side of the interposer 230 may be deployed in parallel locations or may be deployed to cross each other in a zigzag shape.

According to an embodiment of the disclosure, the side plating member 305 may be integrally connected to the via 300. For example, the side plating member 305 may be connected to the via 300 through the interconnect 309. The side plating member 305 may be connected to the array antenna 285 illustrated in FIG. 9 and may operate as a part of the antenna. According to an embodiment of the disclosure, the side plating member 305 may be connected to the ground region 235 through an extension part extending from the ground region 235. The side plating member 305 connected to the via 300 and the ground region 235 may serve as a shield member blocking noise input from an outside of the electronic device 200.

Figure 18:
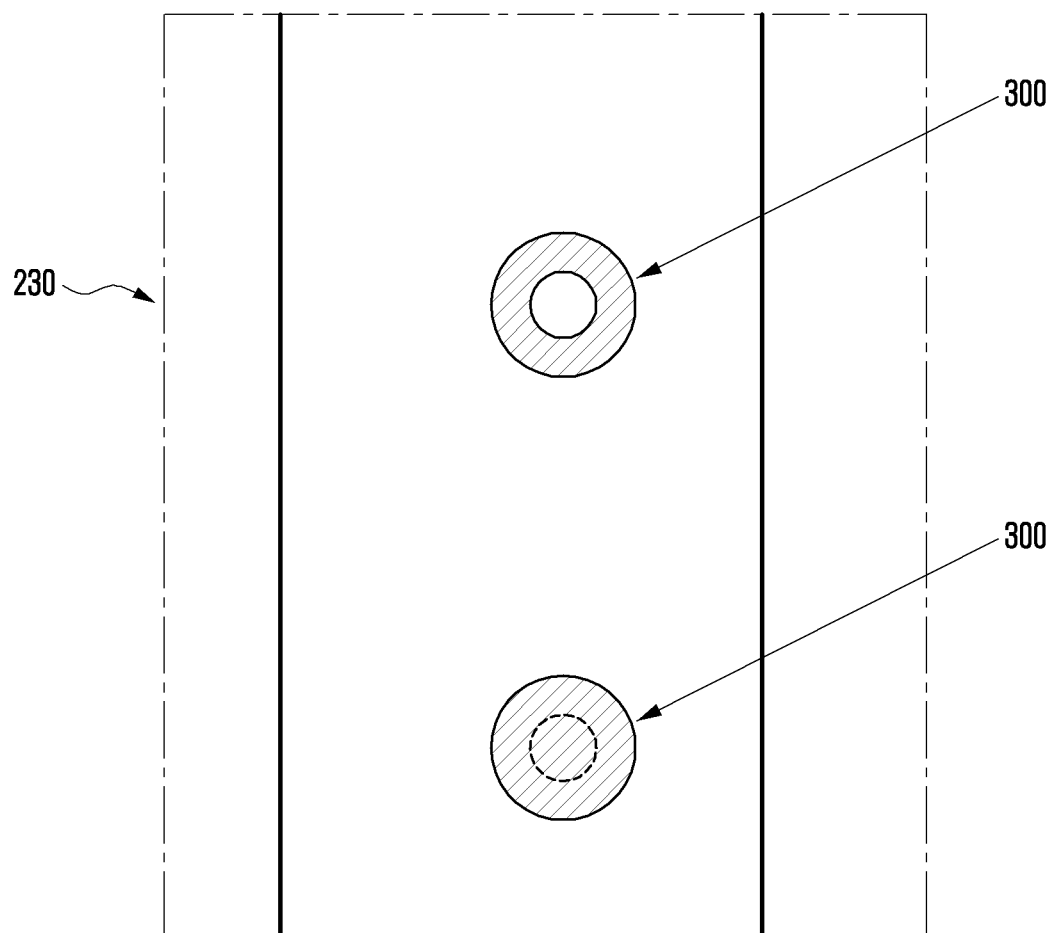
FIG. 18 is a view illustrating a configuration of an interposer of an electronic device according to various embodiments of the disclosure.

FIG. 18 is a view illustrating a configuration of an interposer of an electronic device according to various embodiments of the disclosure.

Referring to FIG. 18, an interposer 230 of an electronic device 200 according to various embodiments of the disclosure may include different vias (e.g., through via and stacked via) 300. As compared with the above-described interposers in FIGS. 13 to 15, the interposer 230 illustrated in FIG. 18 may be configured so that a ground region 235 surrounding the via 300 is not formed. Through this, the width of the interposer 230 can be reduced as large as the removed ground region 235.

According to an embodiment of the disclosure, if a signal of the electronic device 200 is at low speed or a margin of an impedance signal is wide, or if the height of the interposer 230 is low and thus impedance mismatch is within an error range, the ground region 235 can be deleted. If the ground region 235 is not formed in the interposer 230, the interposer 230 may be made of a shield can or EMI molding material that is a shield structure.

According to an embodiment of the disclosure, if the ground region 235 is not formed in the interposer 230, components deployed in an inner space of the interposer 230 or outside the interposer 230 may be shielded through shield can or EMI molding that is a shield structure, and may replace the noise shielding of the removed ground region 235.

Figure 19:
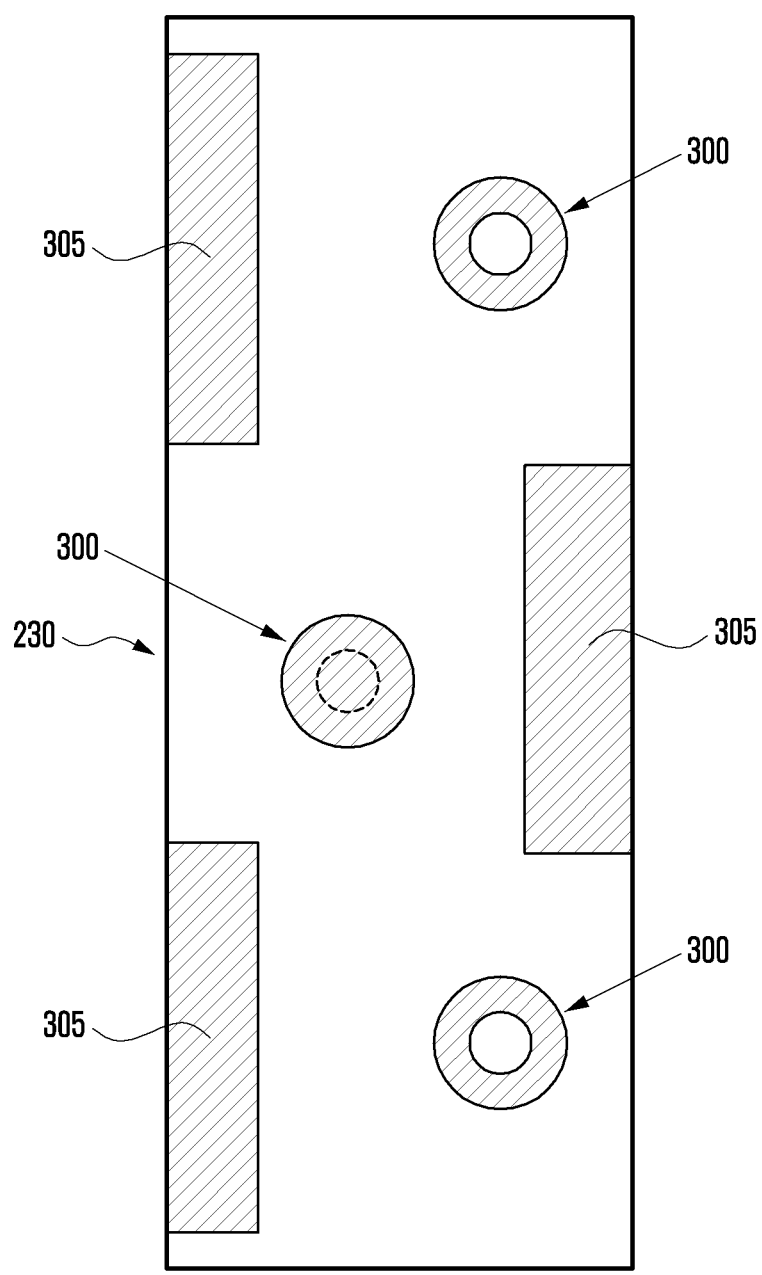
FIG. 19 is a view illustrating a configuration of an interposer, a via, and a side plating member of an electronic device according to various embodiments of the disclosure.

FIG. 19 is a view illustrating a configuration of an interposer, a via, and a side plating member of an electronic device according to various embodiments of the disclosure.

Referring to FIG. 19, an interposer 230 of an electronic device 200 according to various embodiments of the disclosure may include different vias (e.g., through via and stacked via) deployed in a zigzag shape. According to an embodiment of the disclosure, the interposer 230 may have the different vias (e.g., through via and stacked via) deployed in a straight line. According to an embodiment of the disclosure, the interposer 230 may have the same vias (e.g., through vias or stacked vias) deployed in a zigzag shape. According to an embodiment of the disclosure, the interposer 230 may have the same vias (e.g., through vias or stacked vias) deployed in a straight line.

According to various embodiments of the disclosure, a plurality of side plating members 305 may be deployed in a zigzag shape in the interposer 230. For example, the side plating member 305 formed on an outer side of the interposer 230 may block inflow of a noise signal from an outside of the electronic device 200. The side plating member 305 formed on an inner side of the interposer 230 may block a noise signal output from the inside of the electronic device 200 (e.g., the first circuit board 210 and/or second circuit board 220). Through this, the via 300 can be moved adjacent to the first and second keep-out regions 236 and 237, and thus the width of the interposer 230 can be reduced. Further, since an opposite space occurring through the movement of the via 300 is secured as a space in which the side plating member 305 can be generated, it can also serve to shield the inner and outer portions of the interposer 230 as well as reducing the width of the interposer 230.

Figure 20A:
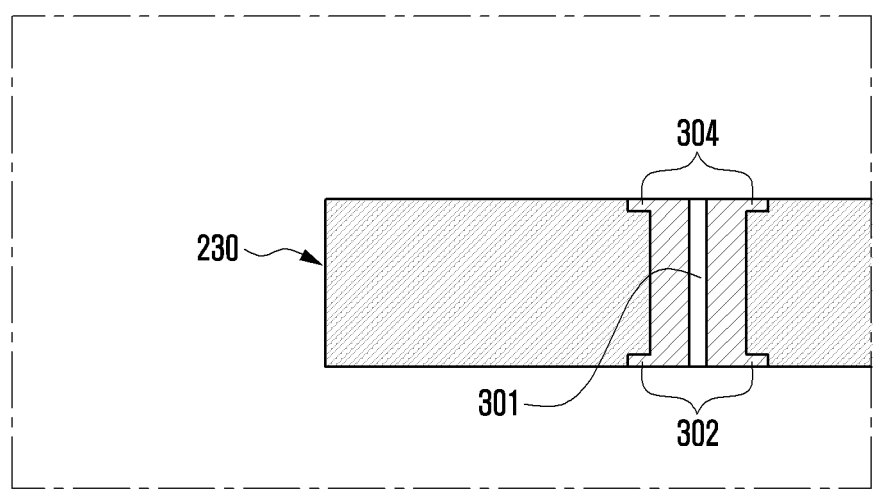
FIGS. 20A, 20B, and 20C illustrate a configuration of a via, an interposer, and a first circuit board of an electronic device according to various embodiments of the disclosure.
Figure 20B:
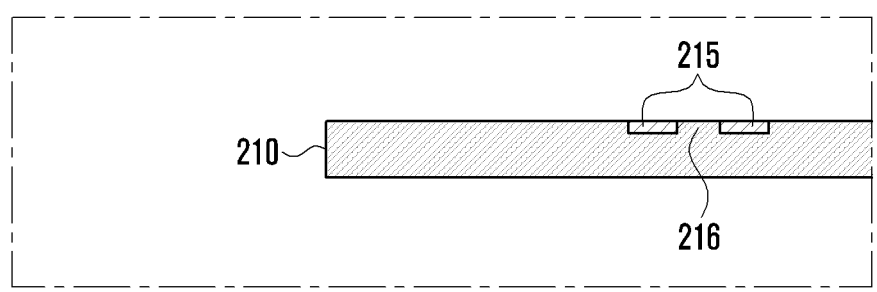
Figure 20C:
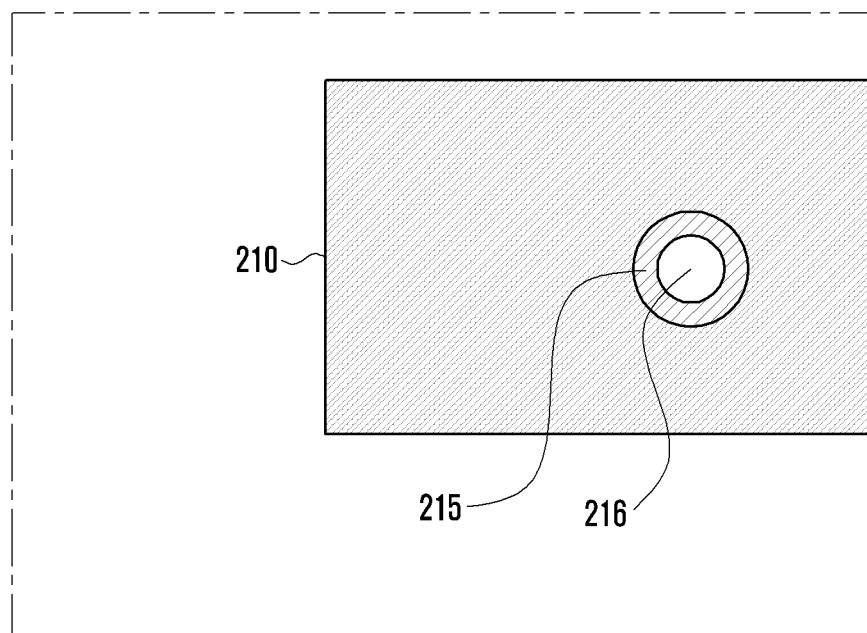

FIGS. 20A to 20C illustrate a configuration of a via, an interposer, and a first circuit board of an electronic device according to various embodiments of the disclosure.

FIG. 20A is a cross-sectional view of a via formed in an interposer according to various embodiments of the disclosure, and FIG. 20B is a cross-sectional view illustrating the configuration of a third conduction pad formed on a first circuit board (or second circuit board) according to various embodiments of the disclosure. FIG. 20C is a plan view illustrating the configuration of a third conduction pad formed on a first circuit board (or second circuit board) according to various embodiments of the disclosure.

Referring to FIG. 20A, an interposer 230 according to various embodiments of the disclosure may include a via (e.g., through via of FIG. 13) 300. The via 300 may include a hole 301, a first pad 302, and a second pad 304.

The hole 301 may be formed to penetrate, for example, at least a part of the interposer 230 through a drill.

The first pad 302 (e.g., first pad 302 of FIG. 7) and the second pad 304 (e.g., second pad 304 of FIG. 7) may be formed to surround an outer side of the hole 301. The first pad 302 may be exposed through a lower portion of the interposer 230. The second pad 304 may be exposed through an upper portion of the interposer 230. The first pad 302 and the second pad 304 may be composed of a copper film and a gold film. According to an embodiment of the disclosure, the first pad 302 may be electrically connected to a first connection terminal 310 deployed on a first circuit board 210. The second pad 304 may be electrically connected to a second connection terminal 320 deployed on a second circuit board 220.

Referring to FIGS. 20B and 20C, on an upper portion of the first circuit board 210 according to various embodiments of the disclosure, a third pad 215 may be deployed to strengthen connectivity with the first pad 302 of the via 300 formed in the interposer 230. The third pad 215 may be deployed in a location corresponding to the first pad 302 of the via 300.

According to an embodiment of the disclosure, a non-plating region 216 may be included inside the third pad 215 deployed on the first circuit board 210. The non-plating region 216 may be deployed in a location corresponding to the hole 301 of the via 300. The area of the non-plating region 216 may be equal to or larger than the area of the hole 301 so that soldering liquid spread on the third pad 315 is prevented from flowing into the hole 301 of the via 300 during application of surface mount devices (SMD) or surface mount technology (SMT), which is the surface mount technology for connecting the first pad 302 of the interposer 230 and the third pad 215 of the first circuit board 210 to each other. According to an embodiment of the disclosure, the third pad 215 deployed on the first circuit board 210 may also be deployed on the second circuit board 220.

Figure 21A:
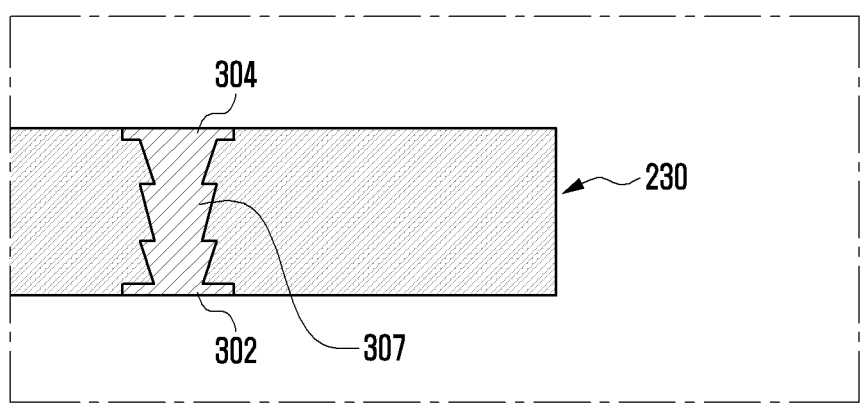
FIGS. 21A, 21B, and 21C illustrate a configuration of a via, an interposer, and a first circuit board of an electronic device according to various embodiments of the disclosure.
Figure 21B:
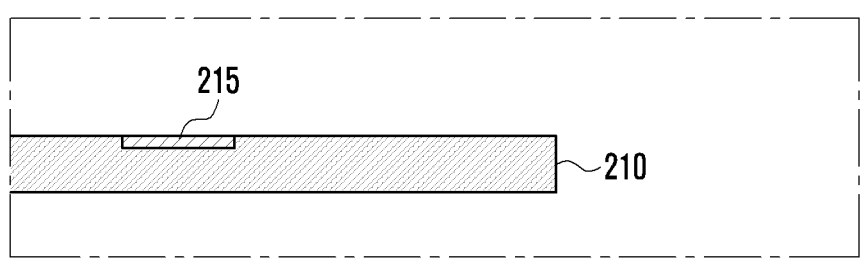
Figure 21C:
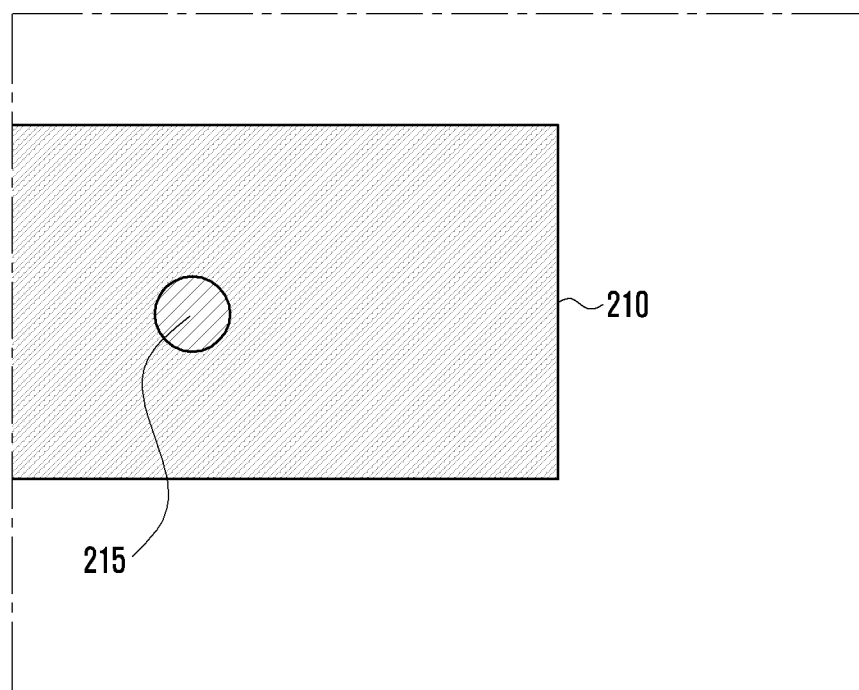

FIGS. 21A to 21C illustrate a configuration of a via, an interposer, and a first circuit board of an electronic device according to various embodiments of the disclosure.

FIG. 21A is a cross-sectional view of a via formed in an interposer according to various embodiments of the disclosure, and FIG. 21B is a cross-sectional view illustrating the configuration of a third conduction pad formed on a first circuit board (or second circuit board) according to various embodiments of the disclosure. FIG. 21C is a plan view illustrating the configuration of a third conduction pad formed on a first circuit board (or second circuit board) according to various embodiments of the disclosure.

Referring to FIG. 21A, an interposer 230 according to various embodiments of the disclosure may include a via (e.g., stacked via of FIG. 14) 300. The via 300 may include an inner via 307, a first pad 302, and a second pad 304.

The inner via 307 may be formed to be smaller than the first pad 302 and/or the second pad 304 for high-speed signal movement.

The first pad 302 (e.g., first pad 302 of FIG. 7) and the second pad 304 (e.g., second pad 304 of FIG. 7) may close an upper portion and a lower portion of the inner via 307. The first pad 302 may be exposed through a lower portion of the interposer 230. The second pad 304 may be exposed through an upper portion of the interposer 230. The first pad 302 and the second pad 304 may be composed of a copper film and a gold film. According to an embodiment of the disclosure, the first pad 302 may be electrically connected to a first connection terminal 310 deployed on a first circuit board 210. The second pad 304 may be electrically connected to a second connection terminal 320 deployed on a second circuit board 220.

Referring to FIGS. 21B and 21C, on an upper portion of the first circuit board 210 according to various embodiments of the disclosure, a third pad 215 may be deployed to strengthen connectivity with the first pad 302 of the via 300 formed in the interposer 230. The third pad 215 may be deployed in a location corresponding to the first pad 302 of the via 300. According to an embodiment of the disclosure, the third pad 215 deployed on the first circuit board 210 may also be deployed on the second circuit board 220.

Figure 22:
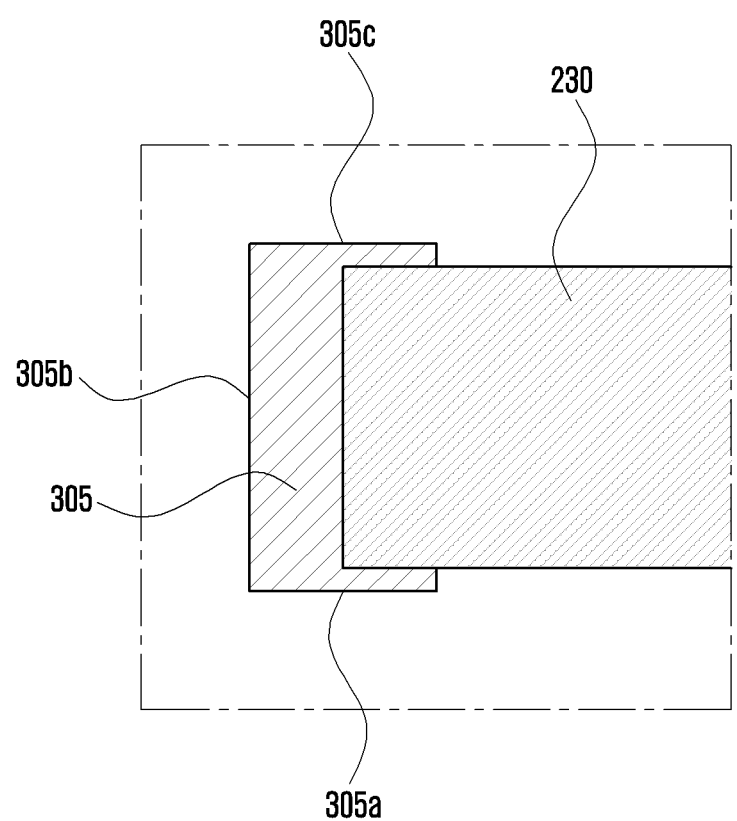
FIG. 22 is a side view illustrating a configuration of an interposer and a side plating member of an electronic device according to various embodiments of the disclosure.

FIG. 22 is a side view illustrating a configuration of an interposer and a side plating member of an electronic device according to various embodiments of the disclosure.

Referring to FIG. 22, a side plating member 305 according to various embodiments of the disclosure may include a first surface (e.g., a lower surface) 305a, a second surface (e.g., a side surface) 305b, and a third surface (e.g., an upper surface) 305c. For example, the side plating member 305 may cover three surfaces (e.g., upper, side, and back surfaces) of the interposer 230. The side plating member 305 may be in a " ⊏ " shape.

According to an embodiment of the disclosure, the side plating member 305 formed on the interposer 230 may block inflow of a noise signal from an outside of the electronic device 200. The side plating member 305 may block a noise signal output from the inside of the electronic device 200 (e.g., the first circuit board 210 and/or second circuit board 220). According to an embodiment of the disclosure, the side plating member 305 may be connected to the array antenna 285 illustrated in FIG. 9 and may operate as a part of the antenna.

Figure 23:
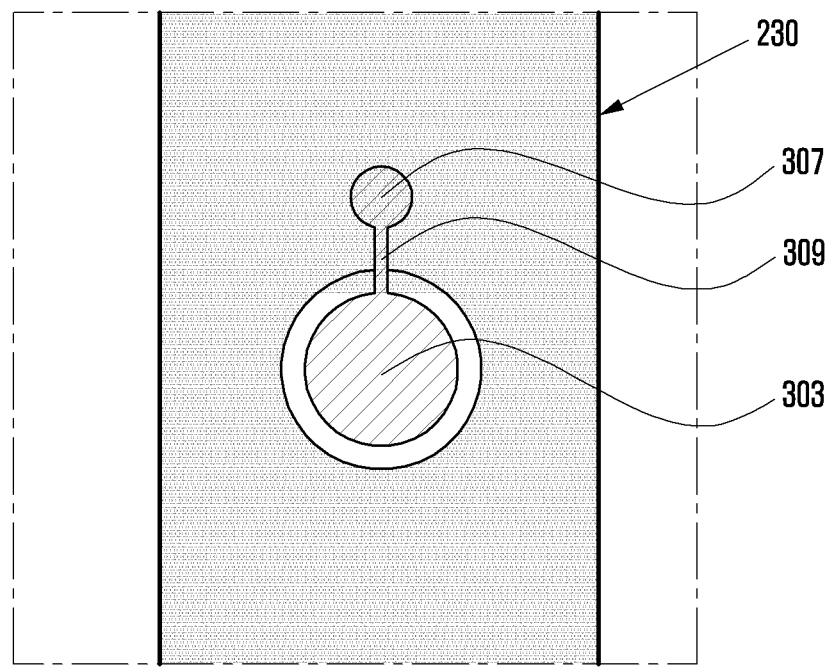
FIG. 23 is a view illustrating a configuration of a via of an electronic device according to various embodiments of the disclosure.

FIG. 23 is a view illustrating a configuration of a via of an electronic device according to various embodiments of the disclosure.

Referring to FIG. 23, an interposer 230 according to various embodiments of the disclosure may include an inner via 307, an interconnect 309, and a plating pad 303. Unlike the via (e.g., stacked via) 300 illustrated in FIG. 14, the inner via 307 and the plating pad 303 may be formed in different regions of the interposer 230. In this case, the inner via 307 and the plating pad 303 may be connected to each other using the interconnect 309. The inner via 307 may be SR-processed so as not to be exposed to an outside, and may exist to be separated from the ground region 235. Through this, in order to electrically connect the first circuit board 210 and the second circuit board 220 to each other, various types of interconnects may exist in the interposer 230 in addition to the vias directly connected to each other in a straight line, and thus flexibility of the interconnects can be heightened.

While the disclosure has been shown and described with reference to various embodiments thereof, it will be understood by those skilled in the art t art that various changes in form and details may be made therein without departing from the spirit and scope of the disclosure as defined by the appended claims and their equivalents.

What is claimed is:

1. A portable communication device comprising:
   a first printed circuit board (PCB);
   a second PCB disposed over or under the first PCB; and
   an interposer disposed between the first PCB and the second PCB, the interposer comprising:
      a first surface facing the first PCB,
      a second surface facing the second PCB,
      an insulating layer disposed between the first surface and the second surface,
      a plurality of signal paths disposed through the insulating layer and electrically connected with the first PCB and the second PCB, the plurality of signal paths including a first signal path and a second signal path at least partially spaced apart from each other, and
      a ground member disposed on the second surface, the ground member including a first ground portion and a second ground portion extended from the first ground portion, an end portion of the first signal path being exposed at the second surface surrounded by the first ground portion, an end portion of the second signal path being exposed at the second surface surrounded by the second ground portion,
   wherein the interposer further comprises another ground member disposed on the second surface and electrically connected with the ground member via a bridge portion.

2. The portable communication device of claim 1, wherein a width of the bridge portion is narrower than a width of the other ground member.

3. The portable communication device of claim 1, wherein the other ground member comprises a substantially circular shape when viewed in a direction substantially perpendicular to the second surface.

4. The portable communication device of claim 1, wherein the end portion of the first signal path or the end portion of the second signal path comprises a substantially circular shape when viewed in a direction substantially perpendicular to the second surface.

5. The portable communication device of claim 4, wherein the substantially circular shape comprises a fully-filled shape without any empty area formed therein.

6. The portable communication device of claim 1,
   wherein each of the first PCB and the second PCB includes a first surface and a second surface, the second surface of the first PCB and the first surface of the second PCB facing the interposer, and
   wherein a first chip is mounted on the second surface of the first PCB, and a second chip is mounted on the second surface of the second PCB.

7. The portable communication device of claim 6, wherein the first chip comprises an application processor (AP).

8. The portable communication device of claim 6, wherein the second chip comprises a transceiver.

9. The portable communication device of claim 6, wherein a third chip is mounted on the first surface of the first PCB.

10. The portable communication device of claim 9, wherein the third chip comprises a communication processor (CP).

* * * * *